(12) United States Patent
Pausini et al.

(10) Patent No.: US 9,140,750 B2
(45) Date of Patent: Sep. 22, 2015

(54) APPARATUS COMPRISING A RECURSIVE DELAYER AND METHOD FOR MEASURING A PHASE NOISE

(75) Inventors: Marco Pausini, Torre de Benagalbon (ES); Jochen Rivoir, Magstadt (DE)

(73) Assignee: ADVANTEST CORPORATION, Tokyo (JP)

( * ) Notice: Subject to any disclaimer, the term of this patent is extended or adjusted under 35 U.S.C. 154(b) by 385 days.

(21) Appl. No.: 13/502,094

(22) PCT Filed: Oct. 21, 2009

(86) PCT No.: PCT/EP2009/007545
§ 371 (c)(1),
(2), (4) Date: Jun. 22, 2012

(87) PCT Pub. No.: WO2011/047698
PCT Pub. Date: Apr. 28, 2011

(65) Prior Publication Data
US 2012/0256639 A1   Oct. 11, 2012

(51) Int. Cl.
*G01R 29/26* (2006.01)
*G01R 31/317* (2006.01)

(52) U.S. Cl.
CPC .............................. *G01R 31/31709* (2013.01)

(58) Field of Classification Search
USPC ............... 324/613, 521, 617, 622, 709, 76.77
See application file for complete search history.

(56) References Cited

U.S. PATENT DOCUMENTS

| 5,101,506 A | 3/1992 | Walls |
| 5,412,325 A * | 5/1995 | Meyers ......................... 324/613 |
| 7,298,464 B1 * | 11/2007 | Egan et al. .................... 356/73.1 |
| 2009/0135967 A1 | 5/2009 | Bock |
| 2010/0048143 A1 * | 2/2010 | Wendler et al. ............ 455/67.13 |

* cited by examiner

*Primary Examiner* — Vincent Q Nguyen

(57) ABSTRACT

Systems and methods for measuring a phase noise of a test signal. A test system includes a recursive delayer, a combiner and a phase noise determinator. The recursive delayer is configured to provide a recursively delayed signal on the basis of the test signal. The combiner is configured to combine a first signal with a second signal to provide a combiner output signal. The first signal is generated based on the test signal and the second signal is generated based on the recursively delayed signal. The phase noise determinator is used to determine phase noise information based on the combiner output signal.

31 Claims, 22 Drawing Sheets

APPARATUS COMPRISING A RECURSIVE DELAYER AND METHOD FOR MEASURING A PHASE NOISE

CROSS-REFERENCES TO RELATED APPLICATIONS

This application is a Continuation of and claims priority to International Application No. PCT/EP2009/007545, filed on Oct. 21, 2009, titled "APPARATUS COMPRISING A RECURSIVE DELAYER AND METHOD FOR MEASURING A PHASE NOISE," by Pausini, et al., which is herein incorporated by reference.

TECHNICAL FIELD

The present disclosure relates generally to the field of phase noise measurement and more specifically to the field of phase noise measurement with a recursive delayer.

BACKGROUND

Phase noise of signal sources is a severe cause of performance degradation in communication systems. Thus, in the production phase of radio frequency (RF) chips that are configured to handle electrical, optical and/or electromagnetic signals in the radio frequency range (3 KHz up to 300 THz), it is very important to accurately measure the phase noise of the device under test (DUT), meanwhile keeping the cost of test (COT) as low as possible.

Delay line discriminator techniques are well known for phase noise measurement and offer the advantage of avoiding external sources with good phase noise properties, for example a local oscillator having a substantially lower phase noise than the device under test. Especially for measurement of phase noise of highest performance devices under test a local oscillator is expected to exhibit less than state of the art phase noise. Delay line discriminator techniques are a phase noise measurement method which does not require a local oscillator. The radio frequency signal to be measured is split in two paths: one path is passed through a tunable phase shifter, and the second path is passed through a delay line. The signal at the output of the phase shifter is then mixed with the signal at the output of the delay line. Delay line discriminators provide a relatively easy and low cost solution for phase noise measurement.

A description of a conventional delay line discriminator can be found in the Microwave Journal of December 1983, page 103 ff.: "Theory and Design of the Delay Line Discriminator for Phase Noise Measurements" by Christopher Schiebold.

However, delay line discriminators are known to suffer severe sensitivity loss for close-in phase noise measurements showing a poor performance, due to the non-zero correlation between the phase noise waveform and its delayed version. The poor performance for close-in phase measurements is due to the strong attenuation that low frequency components undergo when passing through the delay line discriminator. This attenuation can be so strong that the signal falls below the noise floor, making the phase noise measurement virtually impossible. The correlation between the phase noise waveform and its delayed version can be decreased and thus the sensitivity improved by using longer delay lines. However, long analog delay lines are difficult to build.

SUMMARY OF THE INVENTION

Embodiments of this present invention provides a solution to the challenges inherent in high precision measurement of phase noise. In one exemplary embodiment, high precision measurement of phase noise can be achieved by using long delay lines improving measurement sensitivity without adding further complexity or additional cost to the phase noise measurements. Embodiments of the invention avoid the use of an adjustable phase shifter which is complex to handle in discriminator-based phase noise measurements. Embodiments of the invention may not require high precision external sources providing a reference phase. Embodiments of the invention may increase the phase noise measurement sensitivity by means of a recursive delay line architecture, which exploits a feedback path to enhance the measurement sensitivity. Some embodiments of the invention show a gain in measurement sensitivity of about 40 dB over conventional delay line discriminators.

Embodiments of the invention provide an apparatus for measuring a phase noise of a test signal, the apparatus comprising a recursive delayer, a combiner and a phase noise determinator. The recursive delayer is configured to provide a delayed signal on the basis of the test signal. The combiner is configured to combine a first signal with a second signal to provide a combiner output signal, wherein the first signal is based on the test signal or a signal identical to the test signal, and wherein the second signal is based on the delayed signal or a signal identical to the delayed signal. The phase noise determinator is configured to provide a phase noise information depending on the combiner output signal.

Some embodiments of the invention comprise a recursive digital delayer configured to provide a delayed digital signal on the basis of the test signal. Other embodiments of the invention comprise an adjustable recursive delayer. Other embodiments of the invention provide an apparatus which is adapted to receive an analog signal, a digital signal or a square-wave signal.

Embodiments of the invention comprise an analog mixer configured to combine a first analog signal with a second analog signal to provide an analog mixer output signal, wherein the first analog signal is based on a test signal, and wherein the second analog signal is based on the delayed signal. Other embodiments of the invention comprise an analog mixer configured to combine a first analog signal with a second digital signal to provide an analog mixer output signal, wherein the first analog signal is based on a test signal, and wherein the second digital signal is based on the delayed signal. Other embodiments of the invention comprise a digital mixer configured to combine a first digital signal with a second digital signal to provide a digital mixer output signal, wherein the first digital signal is based on a test signal, and wherein the second digital signal is based on the delayed signal. Embodiments of the invention comprise an analog filter to filter the digital mixer output signal.

BRIEF DESCRIPTION OF THE DRAWINGS

The present invention will be better understood from a reading of the following detailed description, taken in conjunction with the accompanying drawing figures in which like reference characters designate like elements and in which.

DETAILED DESCRIPTION

Figure 1A:
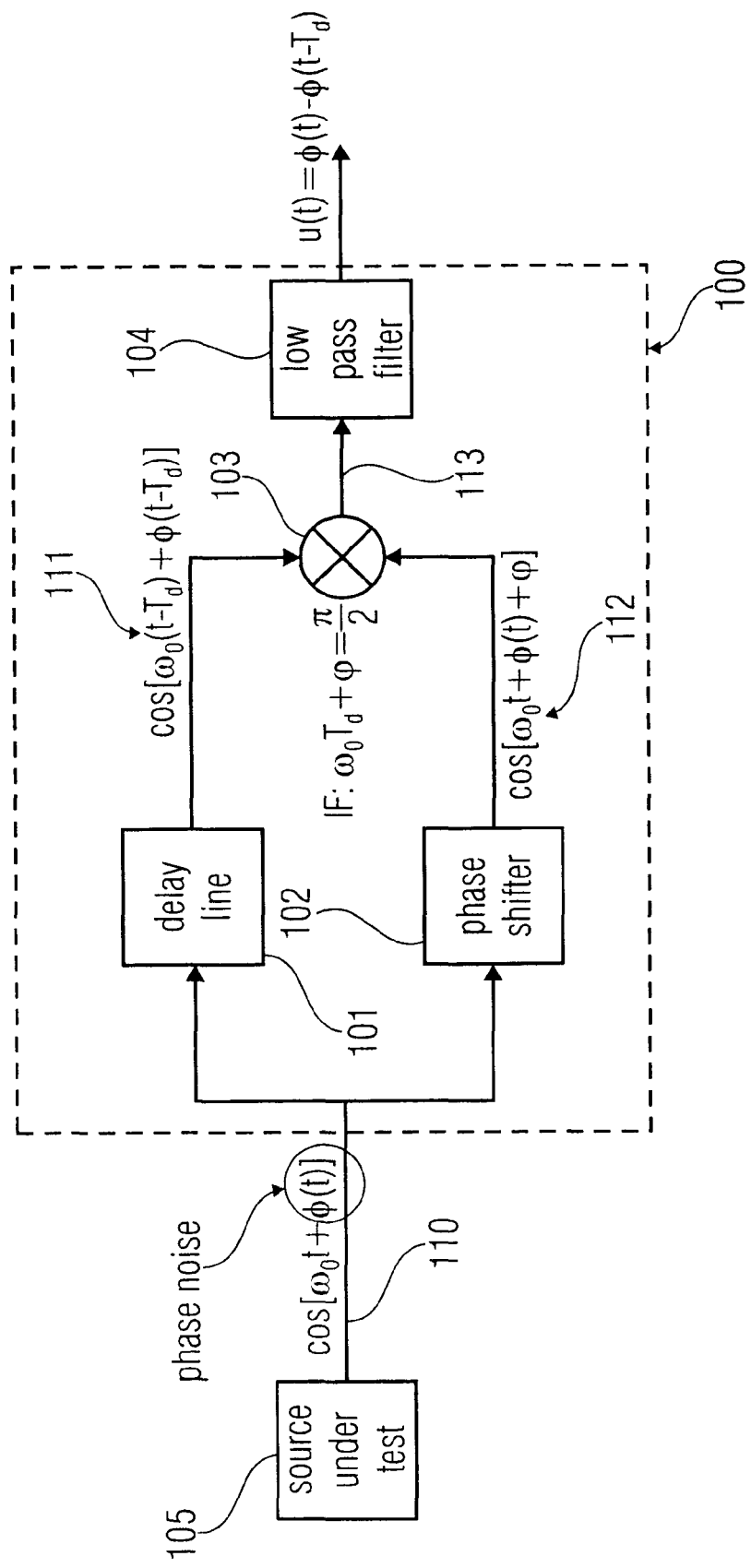
FIG. 1A illustrates an exemplary block diagram of a delay line discriminator, according to the prior art.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

NOTATION AND NOMENCLATURE

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

This present invention provides a solution to the increasing challenges inherent in high precision phase noise measurements. Various embodiments of the present disclosure provide high precision phase noise measurements using long delay lines while improvement measurement sensitivity without adding complexity or additional cost. As discussed in detail below, exemplary embodiments may increase phase noise measurement sensitivity by means of a recursive delay line architecture, which exploits a feedback path to enhance the measurement sensitivity. Some embodiments of the invention show a gain in measurement sensitivity of about 40 dB over conventional delay line discriminators.

FIG. 1A illustrates a block diagram of a delay line discriminator according to a conventional implementation. As illustrated in FIG. 1A, an exemplary delay line discriminator 100 comprises a delay line 101, a phase shifter 102, a mixer 103 and a low-pass filter 104. The delay line discriminator 100 is adapted to measure the phase noise of a test signal 110, which may be provided by a source under test 105. The test signal 110 is input to the delay line 101 and to the phase shifter 102. The delay line 101 provides a delayed test signal 111, which is a delayed version of the test signal 110. The phase shifter 102 provides an output signal, which is a phase shifted test signal 112. The delayed test signal 111 and the phase shifted test signal 112 are input to the mixer 103, which provides a mixed signal 113, the mixed signal 113 being input to the low-pass filter 104. The low-pass filter 104 provides a low-pass filter output signal u(t), which may be analyzed by further units inside the delay line discriminator 100 or outside of the delay line discriminator 100.

In one embodiment the test signal 110 may have a cosine-shaped signal form with an angular frequency $\omega_0$ and a time-depending phase $\phi(t)$, for example, having the form $\cos(\omega t + \phi(t))$. The delayed test signal 111 is a delayed version of the test signal 110, e.g. having the form $\cos(\omega_0(t-T_d)+\phi(t-T_d))$. The phase shifted test signal 112 is a phase shifted version of the test signal 110, for example, with the phase shift $\phi$ having the signal form $\cos(\omega_0 t + \phi(i) + \phi)$. The delayed test signal 111 and the phase shifted test signal 112 have a relation with respect to the delay time $T_d$ of the delay line 101 and the phase $\phi$ of the phase shifter 102, which is expressed by $\omega_0 T_d + \phi = \pi/2$. This condition requires that the inputs to the mixer 103, that is the delayed test signal 111 and the phase shifted test signal 112, are in phase quadrature. The mixer 103 provides a mixed signal 113, which is input to the low-pass filter 104, the low-pass filter 104 providing a low-pass filtered output signal u(t).

The low-pass filtered output signal u(t) may have the signal form $u(t)=\phi(t)-\phi(t-T_d)$. A power spectral density of the low-pass filtered output signal u(t) expresses the power of the low-pass filtered output signal by $P_u(f)=|H(f)|^2 P_\phi(f)$, wherein $P_\phi(i)$ is the power spectral density of the phase noise $\phi(t)$ and $|H(f)|^2$ is the power transmission factor for transmission of the power spectral density of the phase noise to the power spectral density of the low-pass filtered output signal u(t). F describes, for example, a frequency offset from the carrier frequency $\omega_0$. The transfer function from the phase noise $\phi(t)$ to the low-pass filtered output signal u(t) corresponds to $H(f)=1-\exp(-j2\pi f T_d)$.

Due to the delayed test signal 111 and the phase shifted test signal 112 being in phase quadrature, mixed cosine and sine terms in the low-pass filtered output signal u(t) are cancelled. The power spectral density of the low-pass filtered output signal u(t) becomes independent from the angular frequency (or carrier frequency) $\omega_0$ of the test signal 110. To provide this phase quadrature property of the delayed test signal 111 and the phase shifted test signal 112, a tunable phase shifter 102 is required. The tunable phase shifter 102 has to be adjusted for each input frequency (or carrier frequency $\omega_0$) of the test signal 110, making the calibration process time consuming and not well-indicated for automatic measurements. Due to the statistical correlation between the phase noise $\phi(t)$ and the delayed version of the phase noise $\phi(t-T_d)$, the delay line discriminator 100 shows a low sensitivity for close-in phase noise measurements. The statistical correlation is dependent on the delay time $T_d$ of the delay line 101 and may be reduced when increasing the delay time $T_d$. By increasing the delay time $T_d$ the power transmission factor $|H(f)|^2$ is increased resulting in a higher sensitivity of the phase noise measurement. However, increasing the delay time $T_d$ is limited when using analog signals, as long delay lines would be expensive and complex to implement.

Figure 1B:
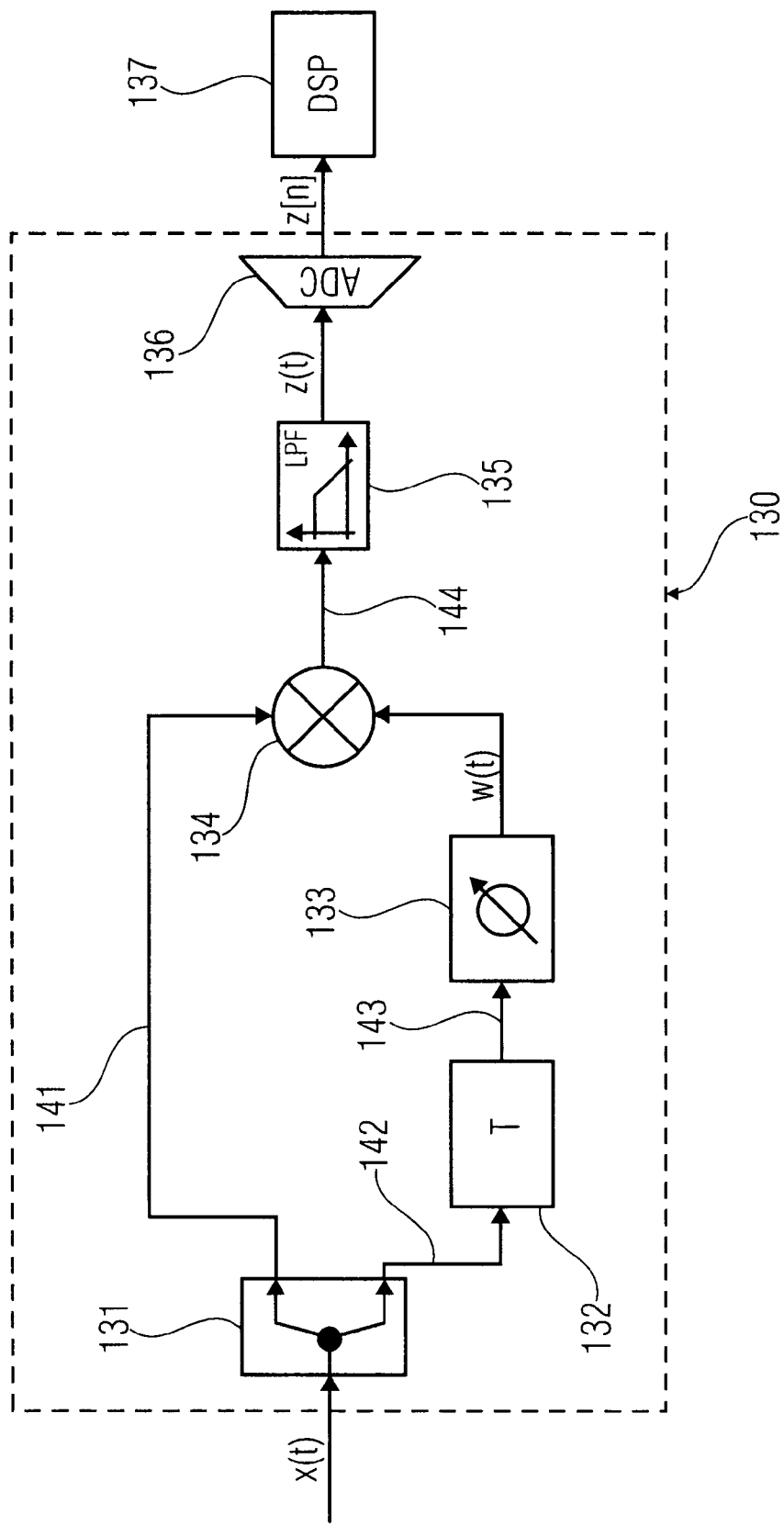
FIG. 1B illustrates an exemplary block diagram of an analog delay line discriminator, according to the prior art.

FIG. 1B illustrates an exemplary block diagram of an analog delay line discriminator according to a conventional implementation. The delay line discriminator 130 comprises a splitter 131, a delay line 132, a phase shifter 133, a mixer 134, a low-pass filter 135 and an analog-to-digital converter 136. The delay line discriminator 130 is configured to receive a radio frequency signal x(t) and is configured to provide a delay line discriminator output signal z(n), which may be further evaluated by a digital signal processor (DSP) 137.

The splitter 131 may be adapted to divide the radio frequency signal x(t) into two equal level signals, a first splitter output signal 141 and a second splitter output signal 142. The delay line 132 is adapted to delay the second splitter output signal 142 to provide a delayed second splitter output signal 143. The phase shifter 133 is adapted to phase shift the delayed second splitter output signal 143 to provide a phase shifter output signal w(t). The mixer 134 is adapted to mix the first splitter output signal 141 and the phase shifter output signal w(t) to provide a mixer output signal 144. The low-pass filter 135 is adapted to low-pass filter the mixer output signal 144 to provide the continuous-time delay line discriminator output signal z(t). The analog-to-digital converter 143 is adapted to convert the continuous-time delay line discriminator output signal z(t) to a discrete-time delay line discriminator output signal z(n), which is the delay line discriminator output signal.

While the direct spectrum measurement and the reference source measurement rely on a clean, low phase noise radio frequency source, the delay line discriminator 130 shown in FIG. 1B does not need a dedicated radio frequency source reference. A splitter 131 is used to divide the radio frequency signal x(t) into two equal level signals 141, 142. One signal 141 is applied directly to a mixer 144, while the second signal 142 is routed to a delay line 132. The output signal 143 of the delay line is passed through a phase shifter 133 to obtain a phase shifted signal ω(t), and then w(t) is fed into the mixer 134. If the phase shifter 133 is tuned such that a phase shift of 90° is performed, then the low-pass filter output signal z(t) becomes $z(t)=V_z(\phi(t)-\phi(t-\tau))$, wherein $V_z$ is the signal amplitude, $\phi(t)$ is the phase noise of the radio frequency signal x(t) and $\phi(t-\tau)$ is the phase noise of the delayed radio frequency signal $x(t-\tau)$, delayed by the time delay $\tau$.

The radio frequency signal x(t) may be expressed as an output of a physical oscillator written as $x(t)=V_x(1+a(t))\cos(\omega_c t+\phi(t))$, where $V_x$ is the signal amplitude, $a(t)$ represents the amplitude modulation noise, and $\phi(t)$ the phase modulation noise, the latter also referred to as phase noise. The angular deviation $\phi(t)$ may involve both deterministic and random components, however in general only the random fluctuations are of interest. By neglecting the amplitude modulation (AM) noise and for small phase modulations, i.e. $|\phi(t)|<<1$, the following is obtained: $x(t)=V_x(\cos(\omega_c t)-\phi(t)\sin(\omega_c t))$, wherein the approximations $\cos(\phi(t))\approx 1$, and $\sin(\phi(t))\approx\phi(t)$ are used.

Figure 1C:
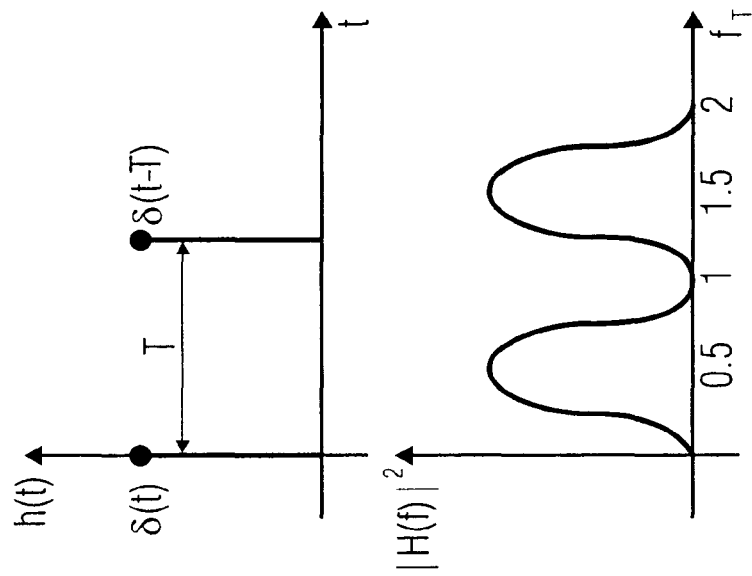
FIG. 1C illustrates exemplary equivalent block diagrams with impulse and frequency responses of the analog delay line discriminator illustrated in FIG. 1B, according to the prior art.
Figure 1C:
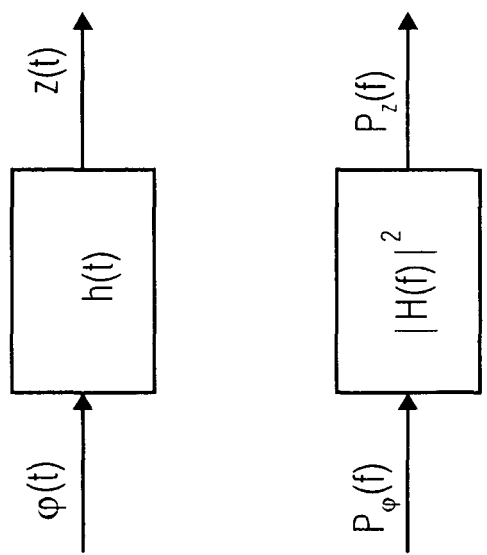

FIG. 1C illustrates exemplary equivalent block diagrams with impulse and frequency responses of the analog delay line discriminator as illustrated in FIG. 1B. The figure shows the impulse response h(t) for transforming the phase noise $\phi(t)$ to the continuous time delay line discriminator output signal z(t), which can be represented by two Dirac impulses $\delta(t)$ and $\delta(t-T)$. Both Dirac impulses have a time distance of T corresponding to the time delay T. FIG. 1C further illustrates the squared value of the frequency responses magnitude $|H(f)|^2$ corresponding to the power transmission factor, by which the power of the phase noise $P_\phi(f)$ is transferred to the power of the delay line discriminator output signal $P_z(f)$. The power transmission factor can be expressed as $|H(f)|^2=2-2\cos(2\pi fT)$, wherein f denotes the frequency of the phase noise $\phi(t)$ and T denotes the time delay of the delay line 132. Reasonable values of T are in the order of a few nanoseconds, while reasonable values off are smaller than 1 MHz in some cases.

Figure 2A:
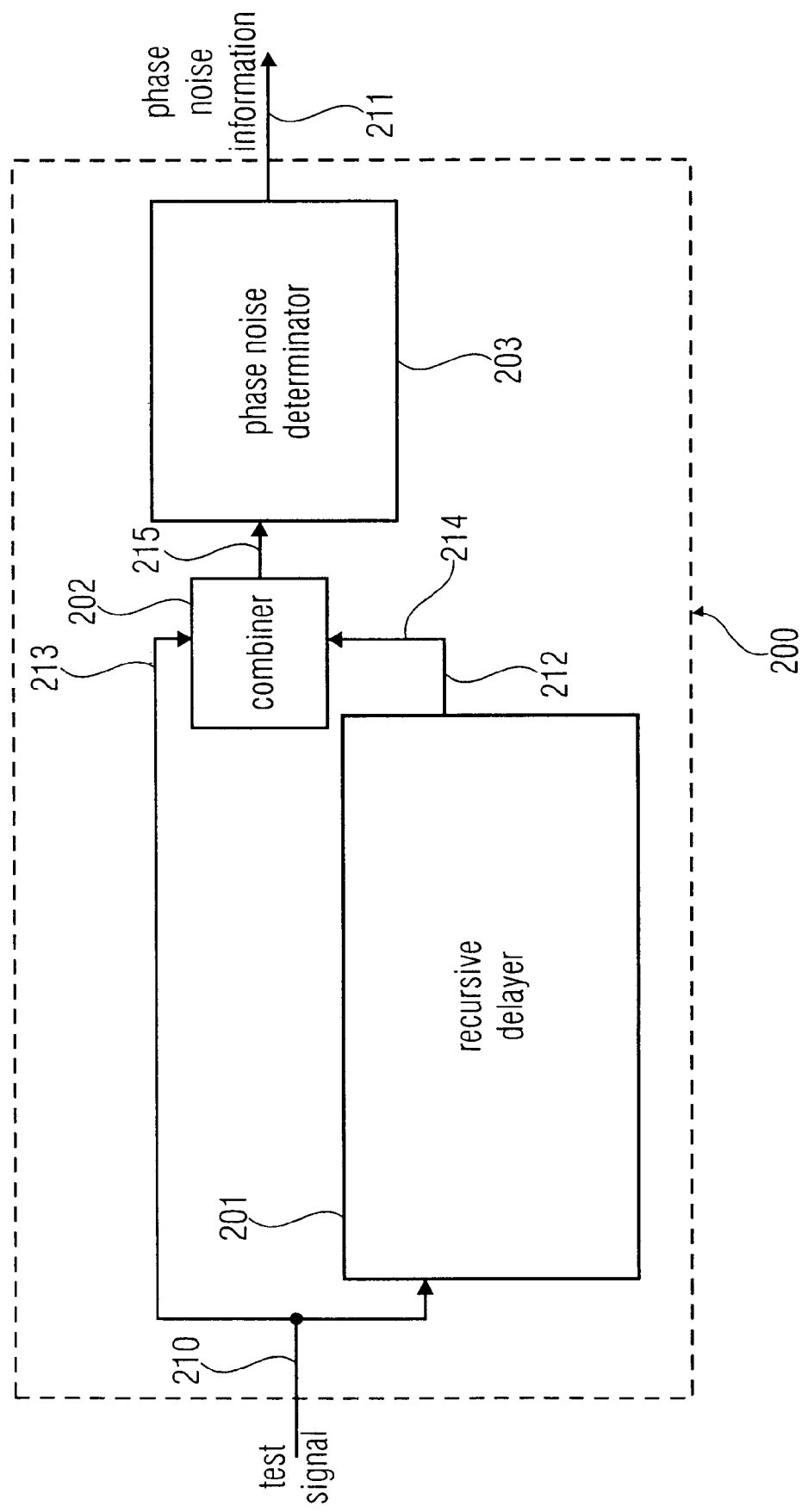
FIG. 2A illustrates an exemplary block diagram of an apparatus comprising a recursive delayer, according to an embodiment of the present invention.

FIG. 2A illustrates an exemplary block diagram of an apparatus comprising a recursive delayer, according to an embodiment of the invention. The apparatus 200 comprises a recursive delayer 201, a combiner 202 and a phase noise determinator 203. The apparatus 200 is adapted to receive a test signal 210 and to provide phase noise information 211. As discussed herein, the phase noise information 211 may be a signal, voltage levels, phase noise components, or signals characterizing the phase noise in the test signal 210 (e.g., random waveform phase fluxuations). The recursive delayer 201 is configured to provide a delayed signal 212 on the basis of the test signal 210. The combiner 202 is configured to combine a first signal 213, which in one embodiment is based on the test signal 210 or is identical to the test signal 210, with a second signal 214, which in one embodiment is based on the delayed signal 212 or is identical to the delayed signal 212, to obtain a combiner output signal 215. The phase noise determinator 203 is configured to provide the phase noise information 211 depending on the combiner output signal 215.

In one exemplary embodiment of the invention the first signal 213 is equal to the test signal 210, and the second signal 214 is equal to the delayed signal 212. The first signal 213 may also be based on the test signal 210, or may be derived from the test signal 210 or may be dependent on the test signal 210. The second signal 214 may also be based on the delayed signal 212, may be derived from the delayed signal 212 or may be dependent on the delayed signal 212. The test signal 210 may be an analog or digital signal of an electric or optical source. The first signal 213 may (for example) be an amplified, attenuated, phase shifted, time shifted, frequency shifted, filtered, equalized, noise affected, digitally sampled or square-wave version of the test signal 210. The second signal 214 may (for example) be an amplified, attenuated, phase-shifted, time shifted, frequency-shifted, filtered, equalized, noise affected, digitally sampled or square-wave version of the delayed signal 212.

In one exemplary embodiment, the recursive delayer 201 is configured to provide the delayed signal 212 on the basis of the test signal 210, such that the delayed signal 212 comprises a superposition of a plurality of time shifted signal components, which signal components are based on the test signal 210, and which signal components are shifted in time with respect to each other. The recursive delayer 201 is adapted to recursively delay a signal based on the test signal 210 or a signal identical to the test signal 210, to provide a recursively delayed signal corresponding to the delayed signal 212. The recursive delayer 201 is configured to provide the delayed signal 212 on the basis of the test signal 210, such that the plurality of time shifted signal components corresponds to a sequence of consecutive time shifted signal components.

The recursive delayer 201 comprises a time delay for delaying the test signal 210 or the signal based on the test signal 210. For example, the recursive delayer may be configured to recursively delay the test signal, such that the delayed test signal comprises a superposition of a plurality of time-shifted versions of the test signal 210 (or of the signal based on the test signal 210). In other words, the recursive delayer may comprise a feedback, such that an output signal of a delay line is fed back to the input of the delay line to obtain the recursive delay. Accordingly, the output signal of the delay line comprises a plurality of time-shifted versions of the test signal 210. For example, if a short portion of the test signal (or of a signal based on the test signal) is considered, the short portion (shorter than the delay time of the delay line) will occur at the output of the delay line, as a component of the delay line output signal, after a certain delay time. If this one-time delayed portion of the test signal 210 (or of the signal based on the test signal 210) is fed back to the input of the delay line again, a two-times delayed version of said portion of the test signal 210 (or of the signal based on the test signal 210) will appear at the output of the delay line (as a "component" of the delay line output signal) after a further period of time. Accordingly, different multiple-times delayed versions of the portion of the test signal 210 (or of the signal based on the test signal 210) will appear at the output of the delay line. The different time-delayed versions of the portion of the test signal 210 may for example decay in amplitude over the iterations.

Taking the test signal 210 as a whole, it can be said that different time-shifted versions of the test signal may be superposed at the output of the delay line, wherein portions of the test signal 210 which have been recursively delayed multiple times may be attenuated when compared to portions of the test signal 210 which have been delayed less often (or only once).

The recursive delayer 201 may affect a plurality of time delays for multiple delaying of the test signal 210 (or the signal based on the test signal 210). The output signal of the recursive delayer may for example be formed using a sequence (or superposition) of signal components which signal components may be time-shifted versions of the test signal. The recursive delayer 201 may be configured to obtain a signal component of the sequence of signal components by time-delaying the test signal 210 (or the signal based on the test signal 210) by the time delay or by a combined time delay, which combined time delay being a combination of the plurality of time delays.

The recursive delayer 201 may be configured to obtain a second signal component of the sequence of signal components, wherein the second signal component is successive to a first signal component of the sequence of signal components, by time delaying the first signal component by a first time delay of the plurality of time delays. The recursive delayer 201 may be further configured to obtain a third signal component of the sequence of signal components, wherein the third signal component is successive to the second signal component, by time delaying the second signal component by a second time delay of the plurality of time delays or by time delaying the first signal component by a sum of the first time delay and the second time delay. The first signal component is delayed by the first time delay to obtain the second signal component, the second signal component is delayed by the second time delay to obtain the third signal component. The third signal component may be obtained by delaying the first signal component by the first time delay and by the second time delay. The first time delay and the second time delay may be identical or may be different. However, the recursive delayer 201 may also delay signal components by multiple time delays. A respective signal component may be delayed by a plurality of time delays to obtain the delayed signal 212.

The recursive delayer 201 may for example be configured to effect a plurality of attenuations. The recursive delayer 201 may obtain one of the signal components of the sequence of signal components by attenuating the test signal 210 (or the signal based on the test signal) by one or more of the plurality of attenuations. The signal component of the sequence of signal components may be first attenuated, then time delayed or may be first time-delayed and then attenuated.

The plurality of time shifted signal components (or signal versions) may be added to obtain the delayed signal 212.

The first signal 213 and the second signal 214 may be in phase quadrature corresponding to a 90° phase shift or a phase shift of 90° plus a multiple integer value of 180°. The recursive delayer 201 may be configured to provide the delayed signal 212 such that the signal components (or time-shifted versions of the test signal 210) of the plurality of signal components (or of the plurality of time-shifted versions of the test signal 210) are in phase with respect to each other, which corresponds to a phase shift of 0° plus an integer multiple of 360°. If the signal components of the plurality of signal components are in phase with respect to each other, each of the signal components of the plurality of signal components may be in phase quadrature to the first signal 213.

Examples for phase quadrature signals are a sine signal and a cosine signal. A multiplication of the sine signal with the cosine signal and a subsequent integration, low-pass filtering or summation of the multiplied signal results in a compensation of both phase-quadrature signals, obtaining a compensated signal, which may be zero in an ideal case. The first signal 213 and the second signal 214 may also be periodic (or at least approximately, if phase noise is considered) rectangular signals or periodic square-wave signals being phase shifted by 90° or by 90° plus an integer multiple of 180° with respect to each other, such that a multiplication (or XOR combination) of the first signal 213 with the second signal 214 and a subsequent summation, low-pass filtering or integration results in a compensation, too. The subsequent summation, low-pass filtering or integration may be performed by the phase noise determinator 203. The phase noise determinator 203 may comprise a low-pass filter for low-pass filtering the combiner output signal 215 to obtain the compensated signal.

A phase modulation (or phase noise) of the test signal 210 may result in a phase modulation (or phase noise) of the first signal 213 and the second signal 214. In the presence of a phase noise or phase modulation of the test signal 210 (or by phase modulating the test signal 210), a phase modulation (or phase noise) of the first signal 213 and the second signal 214 may "pass" the multiplication and subsequent integration such that a power of the phase modulation is detectable by the phase noise determinator 203 providing the phase noise information 211. The phase modulation provides the first signal 213 and the second signal 214 deviating from its phase quadrature. This is for example due to the fact, that the phase modulation (or phase shift) contribution of the first and second signal are brought out of quadrature by different group delays acting on the first signal 213 and on the second signal 214. The deviation from the phase quadrature (or the mixer output signal resulting from this deviation) may be integrated by the subsequent integrator or low-pass filter. A power of the deviation corresponds to the phase noise power or the phase modulation power.

The device comprising the combiner (for example a mixer or XOR-combiner) 202 and the phase noise determinator 203 can also be represented by a correlation device performing a correlation of the first signal 213 and the second signal 214. The result of the correlation corresponds to the phase noise information 211 and may represent the phase noise power. The device comprising the combiner 202 and the phase noise determinator 203 may be a cross-correlation device for calculating the cross-correlation between the first signal 213 and the second signal 214.

The apparatus 200 may represent an autocorrelation device calculating the autocorrelation of the test signal 210 and providing the phase noise information 211 as a measure of the phase noise power. The recursive delayer 201 may provide signal components representing time-shifted values of the test signal 210. The combiner 202 may perform a multiplication of the test signal 210 with the delayed test signal 212 comprising the time-shifted versions of the test signal 210. The second signal 214 corresponding to the delayed test signal 212 comprises the sequence of signal components, which may be time-shifted versions of the test signal 210. The combiner 202 may provide the combiner output signal 215 such that a same signal comprises a superposition of autocorrelation values of the test signal 210. The phase noise determinator 203 may integrate the superposed autocorrelation values of the test signal 210 to provide the phase noise information 211 or the phase noise power. The apparatus 200 may represent an autocorrelation integrator for integrating the autocorrelation values of the test signal 210. By integrating the autocorrelation values of the test signal 210, a measurement sensitivity of the phase noise power may be increased compared to a conventional delay line delaying the test signal 210 by a single delay. An exemplary single delay may correspond to a single signal value of the autocorrelation function of the test signal 210 that is the autocorrelation function of the test signal 210 for the said single delay. Depending on the form of the autocorrelation function of the test signal 210 the sensitivity of the phase noise information 211 may be improved.

The test signal 210 may be a noise signal, for example a white noise or a code sequence transporting the code information by a phase modulation of the test signal 210. The apparatus 200 is configured to detect the phase noise information 211 which is carried within the test signal 210. The apparatus may be a decorrelation receiver for decorrelating the phase modulation information carried within the test signal 210. The test signal 210 may carry a code which may be decoded by the apparatus 200 providing the phase noise information 211 corresponding to the decoded information. The test signal 210 may provide a carrier which is phase and/or amplitude modulated (for example in the form of noise). The carrier may be a sine or cosine-shaped signal. Alternatively, in some embodiments the carrier may be a noise, a pseudo random noise, a code sequence such as a gold code, an in sequence, or may comprise a different signal form. Embodiments of the apparatus 200 comprising a recursive delayer 201 are depicted in the subsequent figures.

Figure 2B:
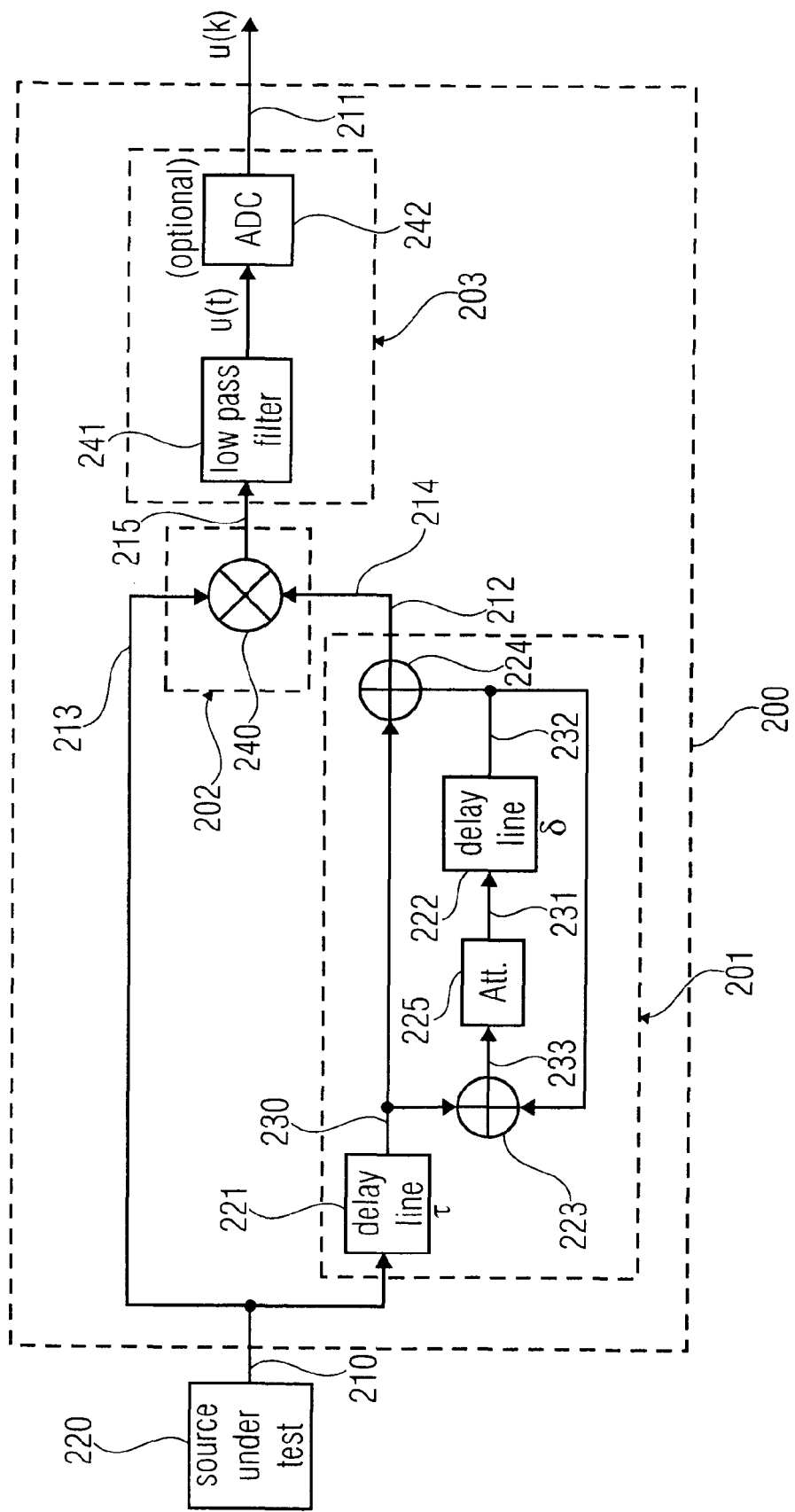
FIG. 2B illustrates an exemplary block diagram of another apparatus comprising a recursive delayer, according to an embodiment of the present invention.

FIG. 2B illustrates an exemplary block diagram of an apparatus comprising a recursive delayer, according to another embodiment of the invention. The apparatus 200 comprises a recursive delayer 201, a combiner 202 and a phase noise determinator 203 which correspond to the respective devices as illustrated in FIG. 2A. The apparatus 200 is adapted to receive a test signal 210 which may be provided by a source under test 220. The apparatus 200 is adapted to provide phase noise information 211.

The recursive delayer 201 comprises a first delay line 221, a second delay line 222, a first adding device 223, a second adding device 224 and an attenuator 225. The first delay line 221 is adapted to delay the test signal 210 by a first delay time $\tau$ to provide a first delayed version 230 of the test signal 210. The second delay line 222 is adapted to delay an attenuated superposition signal 231 by a second delay time $\delta$ to provide a second superposition signal 232. The first adding device 223 is adapted to perform an additive superposition of the first delayed version 230 of the test signal 210 and the second superposition signal 232 to provide a first superposition signal 233. The attenuator 225 is adapted to attenuate the first superposition signal 233 to provide the attenuated superposition signal 231. The second adding device 224 is adapted to perform an additive superposition of the first delayed version 230 of the test signal 210 and the second superposition signal 232 to provide the delayed signal 212. In this embodiment the second signal 214 corresponds to the delayed signal 212 and the first signal 213 corresponds to the test signal 210.

The combiner 202 comprises a multiplicative mixer 240 which is adapted to mix the first signal 213 and the second signal 214 by a multiplication to provide the combiner output signal 215. The phase noise determinator 203 comprises a low-pass filter 241 which is adapted to low-pass filter the combiner output signal 215 to provide the low-pass filter output signal u(t). The low-pass filter output signal u(t) may represent the phase noise information 211. Alternatively, the phase noise determinator 203 may comprise an optional analog-to-digital converter 242 which is configured to convert the continuous time representation of the low-pass filter output signal u(t) to a discrete time representation of the low-pass filter output signal u(k) which may represent the phase noise information 211.

Figure 3A:
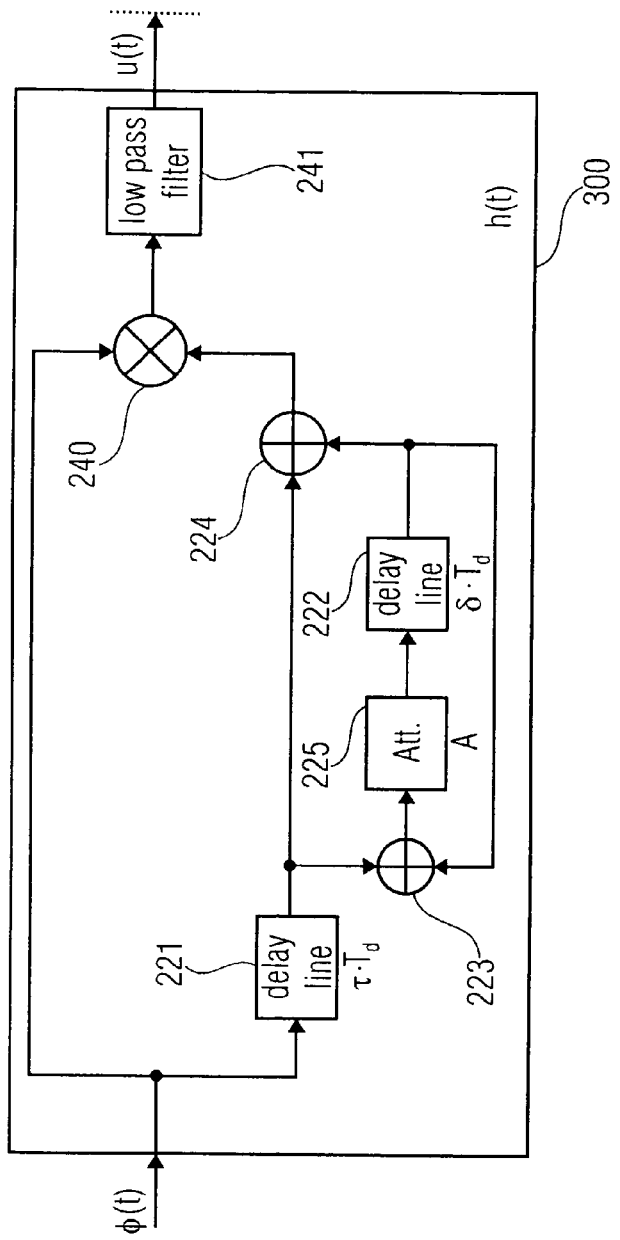
FIG. 3A illustrates an exemplary equivalent block diagram of the apparatus illustrated in FIG. 2B with respect to phase noise transmission, according to an embodiment of the present invention.

FIG. 3A illustrates an exemplary equivalent block diagram of the apparatus as depicted in FIG. 2B with respect to the phase noise transmission, according to an embodiment of the invention. The block diagram of the apparatus 200, as illustrated in FIG. 2B, without the optional analog-to-digital converter 242, represents a block diagram of an impulse response h(t) providing the low-pass filter output signal u(t) when applied to the phase noise $\phi$(t). A mathematical description of the impulse response h(t) may be derived by setting the first delay time of the first delay line 221 to $\tau * T_d$, by setting the attenuation of the attenuator 225 to A and by setting the second delay time of the second delay line 222 to $\delta * T_d$. A description of the impulse response h(t) in the frequency domain is depicted in FIG. 3B.

Figure 3B:
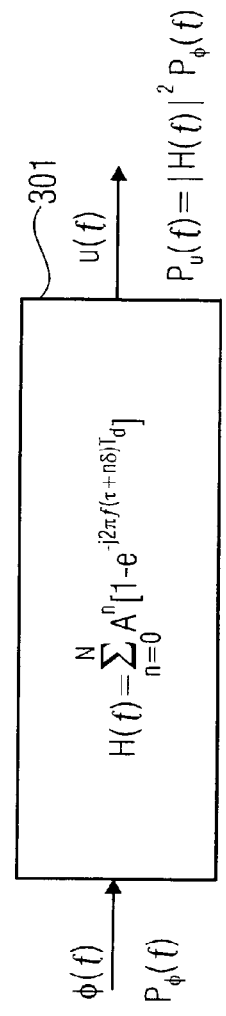
FIG. 3B illustrates an exemplary equivalent block diagram of the apparatus illustrated in FIG. 3A illustrating a frequency response, according to an embodiment of the present invention.

FIG. 3B illustrates an exemplary equivalent block diagram of the apparatus as illustrated in FIG. 3A illustrating the frequency response according to an embodiment of the invention. The equivalent block diagram 301 may be characterized (or expressed) by the formula:

$$H(f) = \sum_{n=0}^{N} A^n [1 - e^{-j2\pi f(\tau + n\delta)T_d}]$$

The frequency response H(f) corresponds to the Fourier transform of the impulse response h(t). The frequency response H(f) describes the transformation of the phase noise $\phi$(f), which is the Fourier transform of $\Phi$(t), to the low-pass filter output signal u(f) which is the Fourier transform of u(t) in the frequency domain. For example, the variable f may determine the frequency offset of the phase noise from the carrier in the test signal 210, and the baseband frequency of the low-pass filter output signal u(f), taking into consideration a frequency down-conversion of the phase noise. The squared absolute value $|H(f)|^2$ of the frequency response H(f) describes the power transmission of the power of the phase noise $P_\phi(f)$ represented in the frequency domain to the power of the low-pass filter output signal $P_u(f)$ represented in the frequency domain. The relation is $P_u(f) = |H(f)|^2 P_\Phi(f)$.

For close-in phase noise having a product off and $\tau * T_d$ close to 0 (and also for not-close-in phase noise), a recursive delay provides additional signal components having the additional delays $\eta\delta * T_d$ (with frequency-delay-product $f * n\delta * T_d$) which result in a higher sensitivity of the frequency response due to the recursive additions of the second delay time $\delta * T_d$. The sensitivity of the frequency response H(f) is improved. The power of the phase noise $P_\phi(f)$ may be attenuated or amplified by the power transmission factor $|H(f)|^2$ such that the power of the phase noise $P_\phi(f)$ is shifted above the noise floor and becomes detectable. The noise power (e.g. the noise power which can be measured using the apparatus 200) will have a higher dynamic range. Measurements have shown that a gain of approximately 40 dB of the recursive delayer with respect to a conventional delayer is possible. In other words, in some cases a noise sensitivity of the apparatus 201 can be improved by 40 dB using an exemplary recursive delayer.

Figure 4:
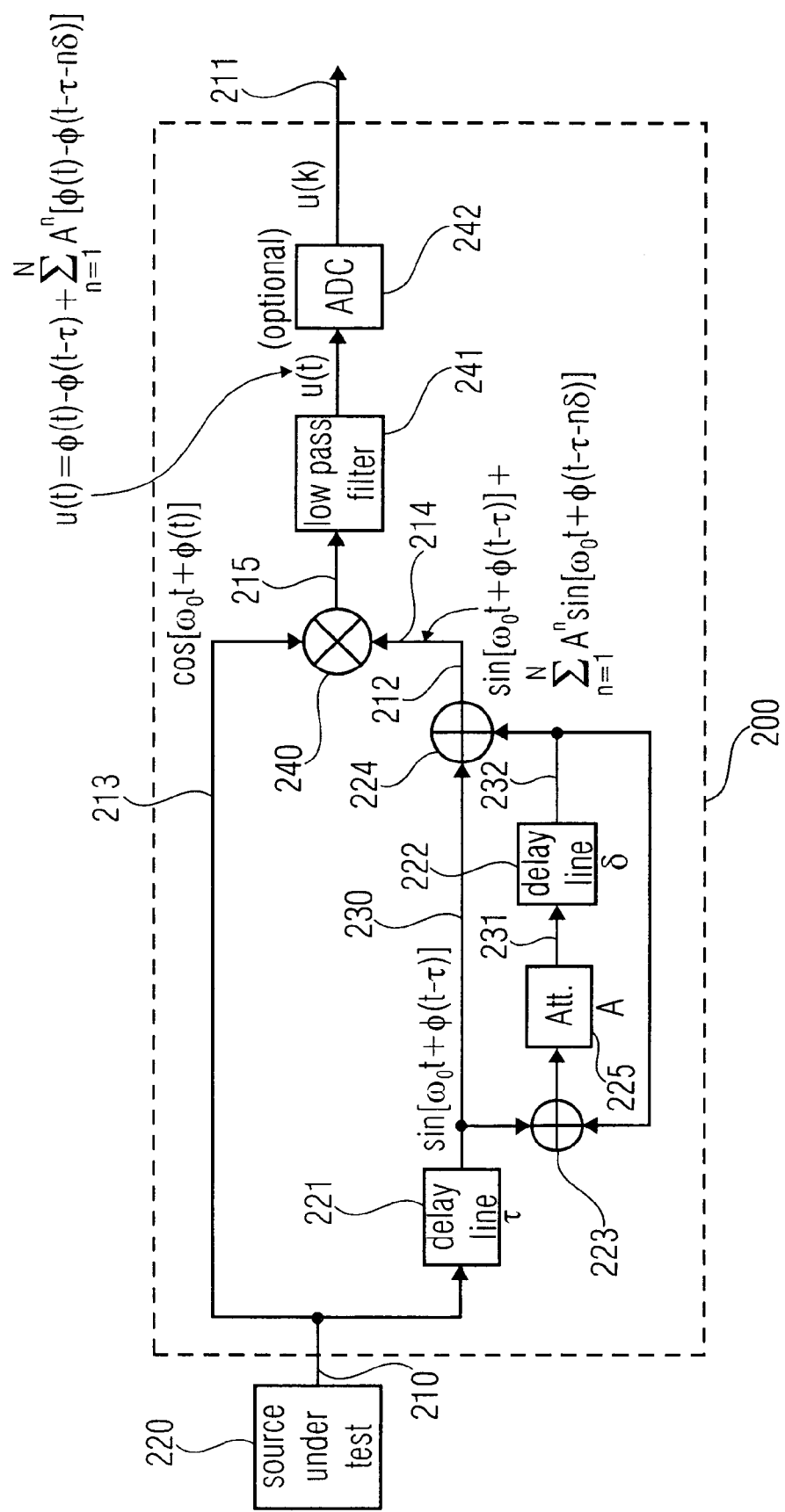
FIG. 4 illustrates an exemplary block diagram as illustrated depicted in FIG. 2B illustrating a transmission of a cosine-shaped test signal modulated in phase according to an embodiment of the present invention.

FIG. 4 illustrates an exemplary block diagram as depicted in FIG. 2B illustrating the transmission of a cosine-shaped test signal modulated in phase according to an embodiment of the invention. The test signal 210 may be expressed by a cosine-shaped signal $\cos(\omega_0 t + \phi(t))$, wherein $\omega_0$ denotes the angular frequency of a carrier and $\phi(t)$ denotes the phase modulation or the phase noise of the carrier. The test signal 110 may alternatively have a rectangular shape, wherein harmonic signal components are filtered by a (low-pass) filter, so that the test signal 110 can affectively be treated as a cosine-shaped signal or as a sine-shaped signal. In general, the test signal 110 may be any at least approximately periodic signal, a carrier wave of which may be represented by a cosine-shaped (or a sine-shaped) signal. Thus, the test signal may even have a triangular shape or any other approximately periodic shape. The first delayed version 230 of the test signal 210 is provided by the first delay line 221 which is adapted to delay the test signal 210 by the first delay time $\tau$. The first delay time $\tau$ is adjusted such that the cosine-shaped test signal 210 is converted to a sine-shaped first delayed version 230 of the test signal 210. The first delay time $\tau$ is adjusted to delay the test signal 210 by a fourth period of the test signal 210 (or of a fundamental frequency thereof) or by a fourth period plus a multiple number of half periods of the test signal 210 such that the cosine-shaped test signal 210 is converted to a sine-shaped first delayed version 230 of the test signal 210. The first delayed version 230 of the test signal 210 may be expressed as $\sin(\omega_0 t + \phi(t-\tau))$.

The second delay line 222 is adapted to delay the attenuated superposition signal 231 by a time delay of δ providing the second superposition signal 232. The second delay time δ is adjusted such that signal components of the sequence of signal components have a sine-shaped signal form. Both, the attenuated superposition signal 231 and the second superposition signal 232 have sine-shaped signal forms (or are in-phase with the first delayed version 230 of the test signal 210 with respect to a fundamental frequency) The second delay time δ is adjusted to delay the attenuated superposition signal 231 by a half signal period or multiples of a half signal period such that the attenuated superposition signal 231 having a sine-shaped signal form is transformed in the second superposition signal 232 having a sine-shaped or a reverse sine-shaped signal form. In other words, the second delay time δ may be adjusted such that the second superposition signal 232 is in phase (±10°) with the first delayed version 230 of the test signal 210 or 180° out of phase (±10°) with respect to the first delayed version of the test signal. The second adding device 224 is adapted to perform an additive superposition of the first delayed version 230 of the test signal 210 having a sine-shaped signal form and the second superposition signal 232 having a sine-shaped signal form to provide the second signal 214. The signal form of the second signal 214 can be represented by a superposition of sine-shaped signal forms.

The second signal may be expressed as:

$$\sin[\omega_0 t + \phi(t-\tau)]\Sigma_{n=1}^{N} A^n \sin[\omega 0t + \phi(t-\tau-n\delta)].$$

By multiplication of the at least approximately cosine-shaped (phase-noise affected) test signal, which corresponds to the first signal 213, with the at least approximately sine-shaped signal components of the sequence (or superposition) of signal components corresponding to the second signal 214, the mixer 240 may provide the mixer output signal 215. The mixer output signal 215 is low-pass filtered by the low-pass filter 241 which provides the low-pass filter output signal, that may be expressed as:

$$u(t) = \phi(t) - \phi(t-\tau) + \Sigma_{n=1}^{N} A^n[\phi(t) - \phi(t-\tau-n\delta)].$$

The low-pass filter output signal u(t) depends on the phase noise φ(t), on the delayed versions of the phase noise φ(t−τ) or φ(t−τ−ηδ), respectively, and on the attenuation A of the attenuator 225. n denotes the sequence number of the sequence of signal components which corresponds to a recursion index. The low-pass filter output signal u(t) does not depend on the carrier frequency $\omega_0$ of the carrier (or fundamental) of the test signal 210. The low-pass filter output signal u(t) or an optional discrete-time representation of the low-pass filter output signal u(k) corresponds to the phase noise information 211.

Figure 5:
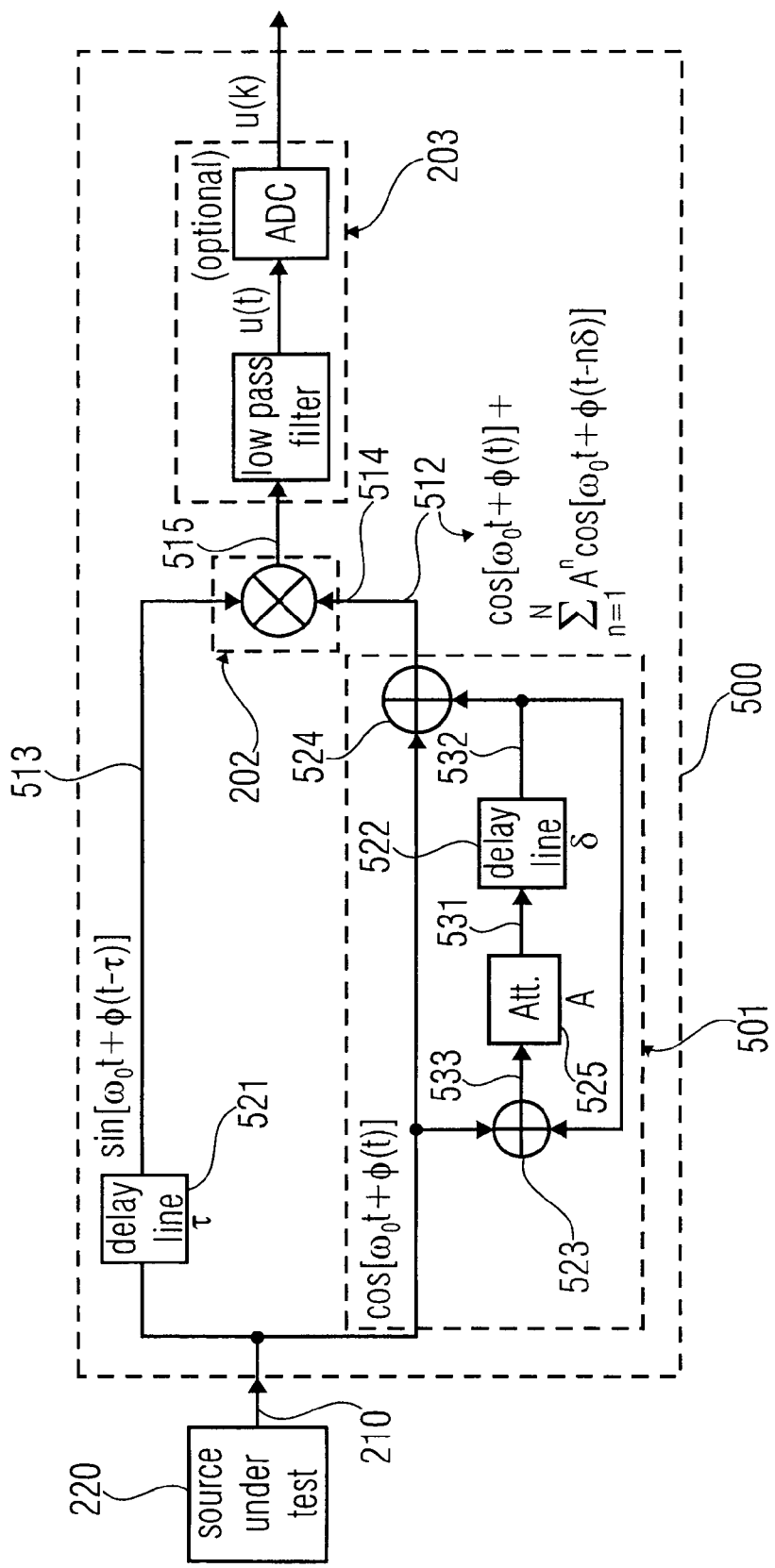
FIG. 5 illustrates an exemplary block diagram of an apparatus comprising a recursive delayer, according to an embodiment of the present invention.

FIG. 5 illustrates an exemplary block diagram of an apparatus comprising a recursive delayer according to another embodiment of the invention. The apparatus 500 comprises a recursive delayer 501 configured to provide a delayed signal 512 on the basis of the test signal 210. In this embodiment the recursive delayer 501 is adapted to receive the test signal 210 and to provide the delayed signal 512. The apparatus 500 further comprises a combiner 202 corresponding to the combiner 202 as illustrated in FIG. 2B and a phase noise determinator 203 corresponding to the phase noise determinator 203 as depicted in FIG. 2B. The combiner 202 is configured to combine a first signal 513, which is based on the test signal 210, with a second signal 514, which is identical to the delayed signal 512, to obtain a combiner output signal 515. The first signal 513 is a delayed version of the test signal 210, delayed by a first delay time τ. The apparatus 500 comprises a first delay line 521 which is adapted to delay the test signal 210 by the first delay time τ to provide the first signal 513. Thus, the phase noise determinator 503 corresponds to the phase noise determinator 203 as depicted in FIG. 2B.

The recursive delayer 501 comprises a first adding device 523, a second adding device 524, an attenuator 525 and a second delay line 522. The first attenuation device 523 is adapted to perform an additive superposition of the test signal 210 and a second superposition signal 532 to provide a first superposition signal 533. The attenuator 525 is adapted to attenuate the first superposition signal 533 by an attenuation A to provide an attenuated superposition signal 531. The second delay line 522 is adapted to delay the attenuated superposition signal 531 by a delay time δ to provide the second superposition signal 532. The second adding device 524 is adapted to perform an additive superposition of the test signal 210 and the second superposition signal 532 to provide the delayed signal 512, which is identical to the second signal 514.

In this embodiment of the invention the test signal 210 has an at least approximately cosine-shaped signal form and may be expressed as $\cos(\omega_0 t + \phi(t))$. The first delay line 521 is adapted to delay the test signal 210 such that the first signal 513 has the signal form $\sin(\omega_0 t + \phi(t-\tau))$. The first signal 513 (or the carrier thereof) is in phase quadrature with respect to the test signal 210. The first delay time τ is adapted to provide the phase quadrature property of the first signal 513 with respect to the test signal 210. The first delay time τ may be a quarter period or a quarter period plus a multiple number of half periods of the carrier of the test signal 210. The frequency of the carrier is represented by the angular frequency $\omega_0$. The recursive delayer 501 is configured to provide a delayed signal 512 comprising a superposition of a plurality of time-shifted signal components such that the signal components of the delayed test signal 512 are in phase (or in reverse phase) with respect to the test signal 210. The second delay line 522 comprises a second delay time δ which may be adjusted to provide said signal components being in-phase. The second delay time δ may be a half period or a multiple number of half periods of the carrier frequency $\omega_0$ of the test signal 210.

The delayed signal 512 comprising the superposition of the plurality of time shifted signal components, has a signal form which may be expressed by:

$$\cos[\omega_0 t + \phi(t)] + \Sigma_{n=1}^{N} A^n \cos[\omega 0t + \phi(t-n\delta)].$$

Figure 6:
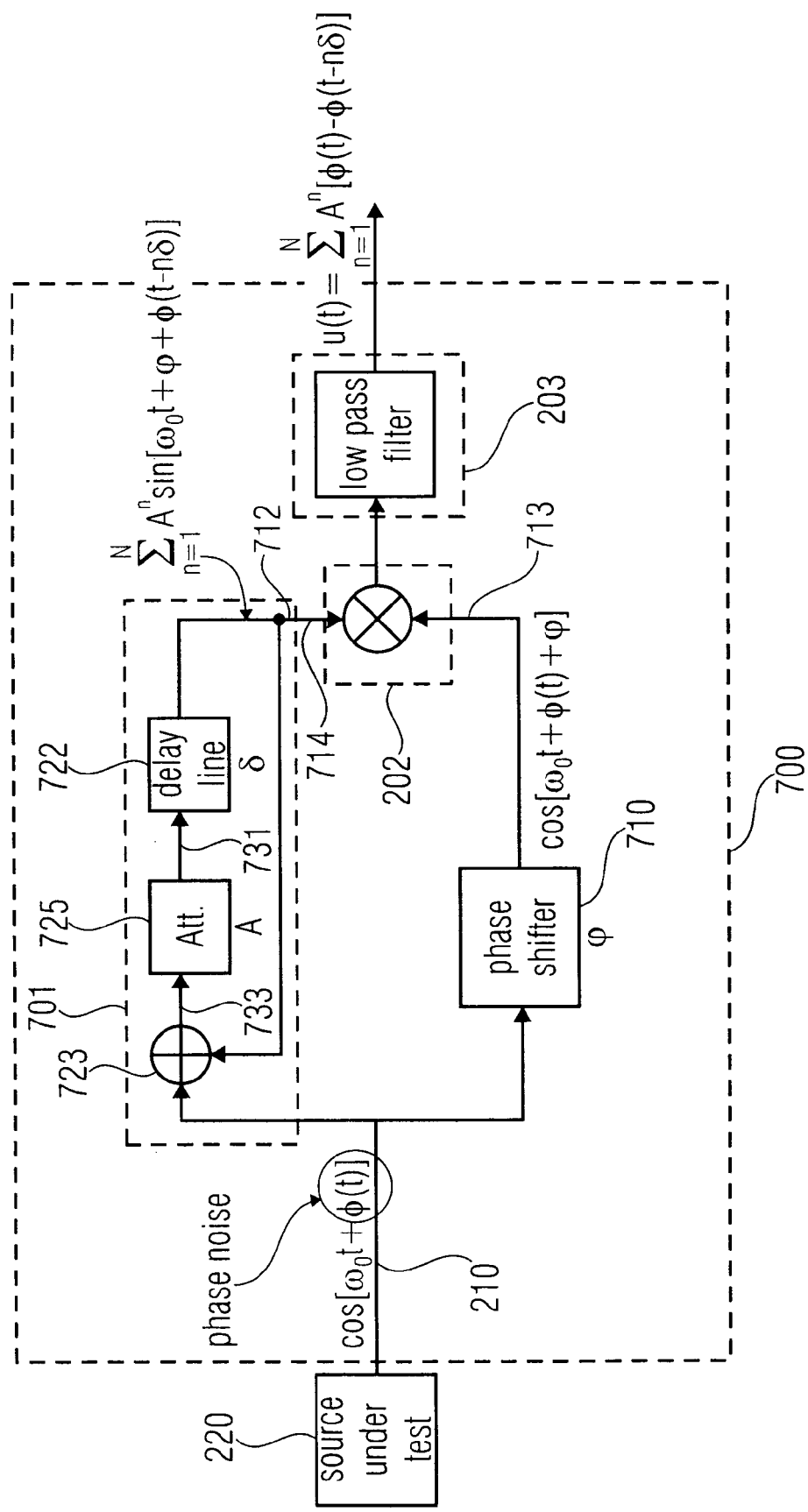
FIG. 6 illustrates an exemplary block diagram of an apparatus comprising a recursive delayer, according to an embodiment of the present invention.

FIG. 6 illustrates an block diagram of an apparatus comprising a recursive delayer according to another embodiment of the invention. The apparatus 700 comprises a recursive delayer 701, a combiner 202 corresponding to the combiner 202 as illustrated in FIG. 2B, a phase noise determinator 203 corresponding to the phase noise determinator 203 without the optional analog-to-digital converter 242 as depicted in FIG. 2B, and further comprises a phase shifter 710. The recursive delayer 701 is adapted to recursively delay the test signal 210 to provide a delayed signal 712 which is identical to the second signal 714. The phase shifter 710 is adapted to phase shift the test signal 210 to provide the first signal 713. The phase shifter 710 shifts the test signal 210 by a phase of φ.

In one exemplary embodiment, the recursive delayer 701 comprises an adding device 723 which is adapted to perform an additive superposition of the test signal 210 and the delayed signal 712 to provide a first superposition signal 733. The recursive delayer 701 further comprises an attenuator 725 which is adapted to attenuate the first superposition signal 733 by an attenuation A to provide an attenuated superposition signal 731. The recursive delayer 701 further comprises a delay line 722 which is adapted to delay the attenuated superposition signal 731 by a time delay δ to provide the delayed signal 712.

The test signal 210 comprises a carrier of an angular frequency $\omega_0$ and a phase modulation or phase noise φ(t), respectively, having the signal form $\cos(\omega_0 t+\phi(t))$. The first signal 713, which is an output signal of the phase shifter 710 shifting the test signal 210 by the phase φ, may be expressed by $\cos(\omega_0 t+\phi(t)+\varphi)$. The delayed signal 712 may be expressed by $$\sum_{n=0}^{N} A^n \sin[\omega_0 t + \varphi + \phi(t - n\delta)].$$

The continuous time representation of the low pass filter output signal u(t) may be expressed as $$u(t) = \sum_{n=1}^{N} A^n [\phi(t) - \phi(t - n\delta)].$$

Figure 7:
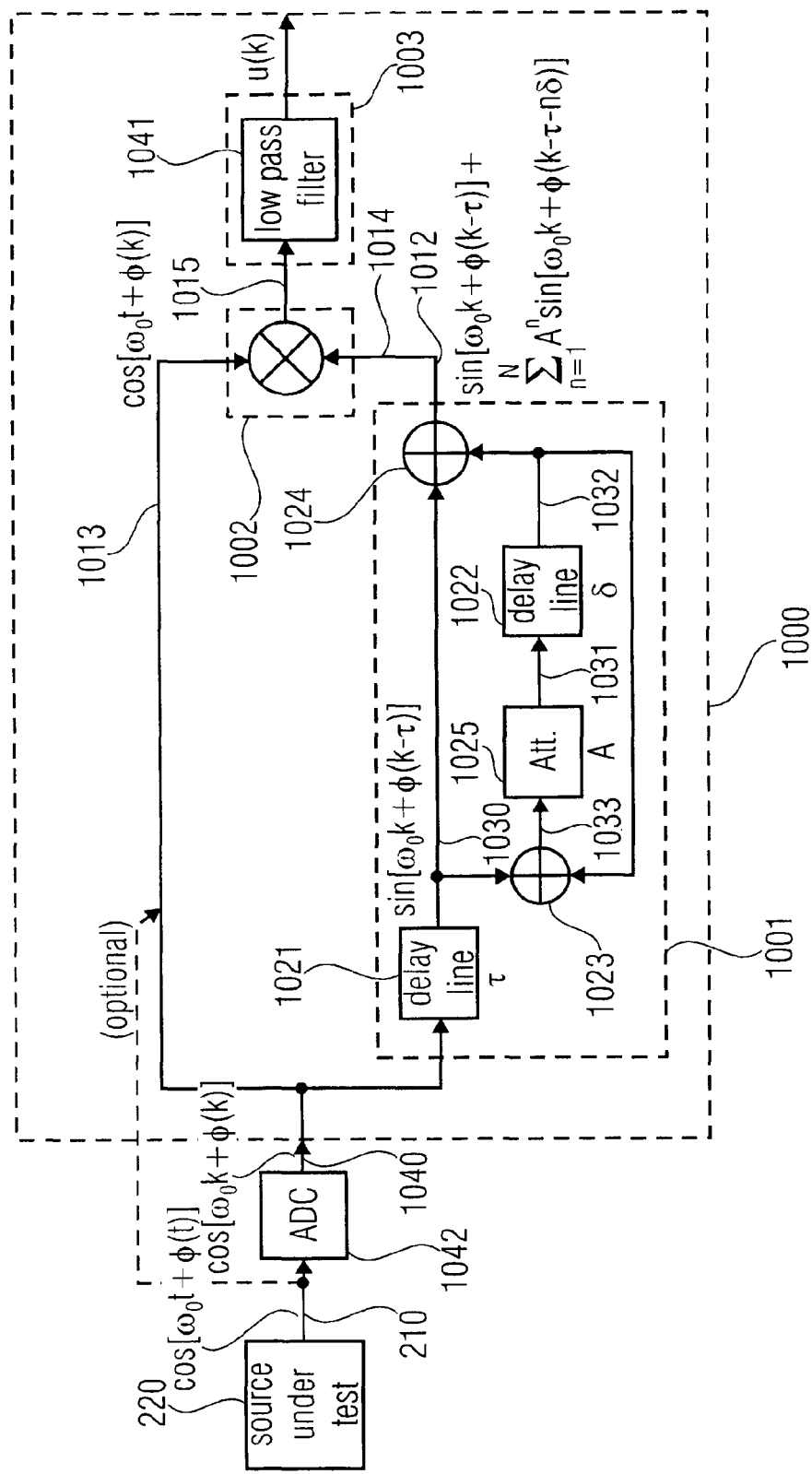
FIG. 7 illustrates an exemplary block diagram of an apparatus comprising a recursive digital delayer, according to an embodiment of the present invention.

FIG. 7 illustrates an exemplary block diagram of an apparatus comprising a recursive digital delayer according to an embodiment of the invention. The apparatus 1000 comprises a recursive digital delayer 1001, a combiner 1002 and a phase noise determinator 1003. The recursive digital delayer 1001 is configured to provide a delayed digital signal 1012 on the basis of a digital test signal 1010. The combiner 1002 is adapted to combine a first signal 1013, which is identical to the digital test signal 1010 or optionally identical to the (analog) test signal 210, with a second signal 1014, which is identical to the delayed digital signal 1012, to obtain a combiner output signal 1015. The phase noise determinator 1003 is configured to provide a phase noise information u(k) that depends on the combiner output signal 1015.

The digital test signal 1010 may represent a discrete-time version of the test signal 210 which may be provided by a source under test 220. The discrete-time version of the test signal 210 may be provided by an analog-to-digital converter 1042 adapted to convert the test signal 210 to the digital test signal 1010. In this embodiment the apparatus 1000 does not comprise the analog-to-digital converter 1042. In other embodiments the apparatus 1000 also comprises the analog-to-digital converter 1042. The combiner 1002 may be an analog combiner (e.g. a multiplier or mixer) adapted to perform an analog combination of the first signal 1013 and the second signal 1014 to provide an analog combiner output signal 1015. The combiner 1002 may also be a digital combiner (e.g. an XOR combiner) adapted to digitally combine the first signal 1013 with the second signal 1014 to provide a digital combiner output signal 1015 (e.g. a binary signal). The phase noise determinator 1003 comprises a low-pass filter adapted to low-pass filter the combiner output signal 1015 to provide a low pass filter output signal u(k) corresponding to the phase noise information. The low pass filter 1041 may preferably be an analog low pass filter providing an analog low pass filter output signal u(t). The analog filters may for example be implemented using a RC-circuit. However, other implementations are also possible. The first signal 1013 and/or the second signal 1014 may be analog or digital signals. The low-pass filter 1041 may be an analog filter for analog low-pass filtering a digital (e.g. binary) combiner output signal 1015. The latter case may be advantageous for removing aliasing components from the digital combiner output signal 1015 to have a better detection of the phase noise power corresponding to the phase noise information u(k).

The analog-to-digital converter 1042 may also provide a square-wave test signal as the digital test signal 1010. An exemplary square-wave test signal comprises two signal states, a first signal state corresponding to a positive signal value of the test signal 210 and a second signal state corresponding to a negative signal value of the test signal 210. Both signal values represent a logical value, which may be processed by a digital combiner, for example an XOR gate or XNOR gate.

The digital test signal 1010 may for example have a rectangular-shaped (or approximately rectangular shaped) signal form. The rectangular-shaped signal form may for example be derived from the analog signal 210 using a threshold comparator, wherein the threshold comparator may act, for example, as a single-bit analog-to-digital converter (taking over the functionality of the analog-to-digital converter 1042). Alternatively, a signal provided by a digital circuit (for example a digital oscillator) may serve as a digital test signal 1010. For example, the digital test signal 1010 may be derived from a cosine-shaped signal of the form $\cos(\omega_0 t+\Phi(t))$ using a threshold comparator. Accordingly, the digital test signal 1010 may for example describe a sign of an analog test signal 210.

A fundamental frequency signal of the digital test signal may therefore be approximated by a signal component of the form $\cos(\omega_0 n+\Phi(n))$ (or $\sin(\omega_0 n+\Phi(n))$, or any time-shifted version thereof). Naturally, the digital test signal 1010 may comprise harmonic components, which however do not have significant impact (or disturbing impact) on the functionality of the circuit disclosed herein. Alternatively, the analog test signal 210 may be sampled with a higher accuracy (higher than a single-bit accuracy). Accordingly, the digital test signal 1010 may approximate the analog test signal 210 with improved accuracy. For example, the digital test signal 1010 may comprise the form $\cos(\omega_0 n+\Phi(n))$, wherein n denotes the discrete sampling times at which the test signal 210 is sampled.

Assuming a single-bit analog-to-digital conversion of a digital test signal 1210 having a fundamental component of the form $\cos(\omega_0 n+\Phi(n))$, the digital test signal 1010 may take the form sign $(\cos(\omega_0 n+\Phi(n)))$, wherein sign(x) (also designated as sign {x}) designates a function yielding the sign of the argument x. Similarly, a time-shifted version of the digital test signal 1010 may take the form sign $\{\cos(\omega_0(n-d)+\Phi(n-d))\}$. A phase-shaped version of the digital test signal 1010 may take the form sign $(\sin(\omega_0 n+\Phi(n)))$.

The sign function "sign(x)" used herein provides an output value of 1 (or logic "high") for positive input values and provides an output value of −1 (or logic "low") for negative input values. Further, the sign function used here may for example provide the value of +1 or −1 for an input value of 0. Accordingly, the sign function used here may deviate from the mathematically defined sign function with its three possible output levels {−1, 0, +1}, because the mathematically defined sign function does not accurately describe the conversion into a digital signal with two levels.

The structure of the recursive digital delayer 1001 corresponds to the structure of the recursive delayer 201 as illustrated in FIG. 2B, but where internal components of the recursive digital delayer 1001 are adapted to process digital signals. The recursive digital delayer 1001 comprises a first digital delay line 1021, a second digital delay line 1022, a first adding device 1023, a second adding device 1024 and an attenuator 1025. The first digital delay line 1021 is adapted to digitally delay the digital test signal 1010 by a first digital delay timer to provide the first delayed version 1030 of the digital test signal 1010. The first adding device 1023 is adapted to perform an additive superposition of the first delayed version 1030 of the digital test signal 1010 and a second superposition signal 1032 to provide a first superposition signal 1033. The attenuator 1025 is adapted to attenuate the first superposition signal 1033 by an attenuation A to provide an attenuated superposition signal 1031. The second digital delay line 1022 is adapted to digitally delay the attenuated superposition signal 1031 by a second digital delay time δ to provide the second superposition signal 1032. The second adding device 1024 is adapted to perform an additive superposition of the first delayed version 1030 of the digital test signal 1010 and the second superposition signal 1032 to provide the delayed digital signal 1012 which corresponds to the second signal 1014.

The first and second digital delay lines 1021, 1022 may comprise buffers providing a digital delay corresponding to the time an input of the buffer is buffered. The buffers may optionally be controlled by a control signal, for example by a clock signal. The attenuator 1025 may comprise a digital multiplication. The first and second digital delay lines 1021, 1022 may also comprise Hilbert transformers providing 90° phase-shifted output signals with respect to their input signals. In this embodiment the first digital delay line 1021 provides the first delayed version 1030 of the digital test signal 1010 such that the first delayed version 1030 is in phase quadrature to the digital test signal 1010. The second digital delay line 1022 provides the second superposition signal 1032 such that the second superposition signal 1032 is in phase or in reverse phase with the first superposition signal 1033, and in phase or in reverse phase with the first delayed version 1030 of the digital test signal 1010. The second digital delay line 1022 may comprise a series connection of two buffers (or two Hilbert transformers) providing a phase shift of 180° of the second superposition signal 1032 with respect to the first superposition signal 1033. The first digital delay line 1021 may comprise a single buffer (or a single Hilbert transformer) providing the first delayed version 1030 of the digital test signal 1010 being in phase quadrature to the digital test signal 1010.

The recursive digital delayer 1001 may be implemented by a digital electronic circuit, for example by an ASIC, by a field programmable gate array, or by a programmable logic device. In some cases the recursive delayer may be implemented with a microchip or microprocessor or may be implemented on a computer system. The apparatus 1000 may be implemented by an electronic circuit, for example an integrated circuit, a microprocessor or a logic device. The apparatus 1000 may be configured to receive a digital test signal 1010 having a signal form sign $\{\cos((\omega_0 k+\phi(k))\}$. The recursive digital delayer 1001 may be adapted to provide the second signal 1014 such that the second signal 1014 is in phase quadrature to the first signal 1013 which corresponds to the digital test signal 1010. In one embodiment, the digital test signal 1010 is a discrete time representation of the test signal 210 having the signal form sign $\{\cos(\omega_0 t+\phi(t))\}$, corresponding to a carrier with the angular frequency $\omega_0$ and a phase modulation or phase noise of $\phi(t)$.

Figure 8:
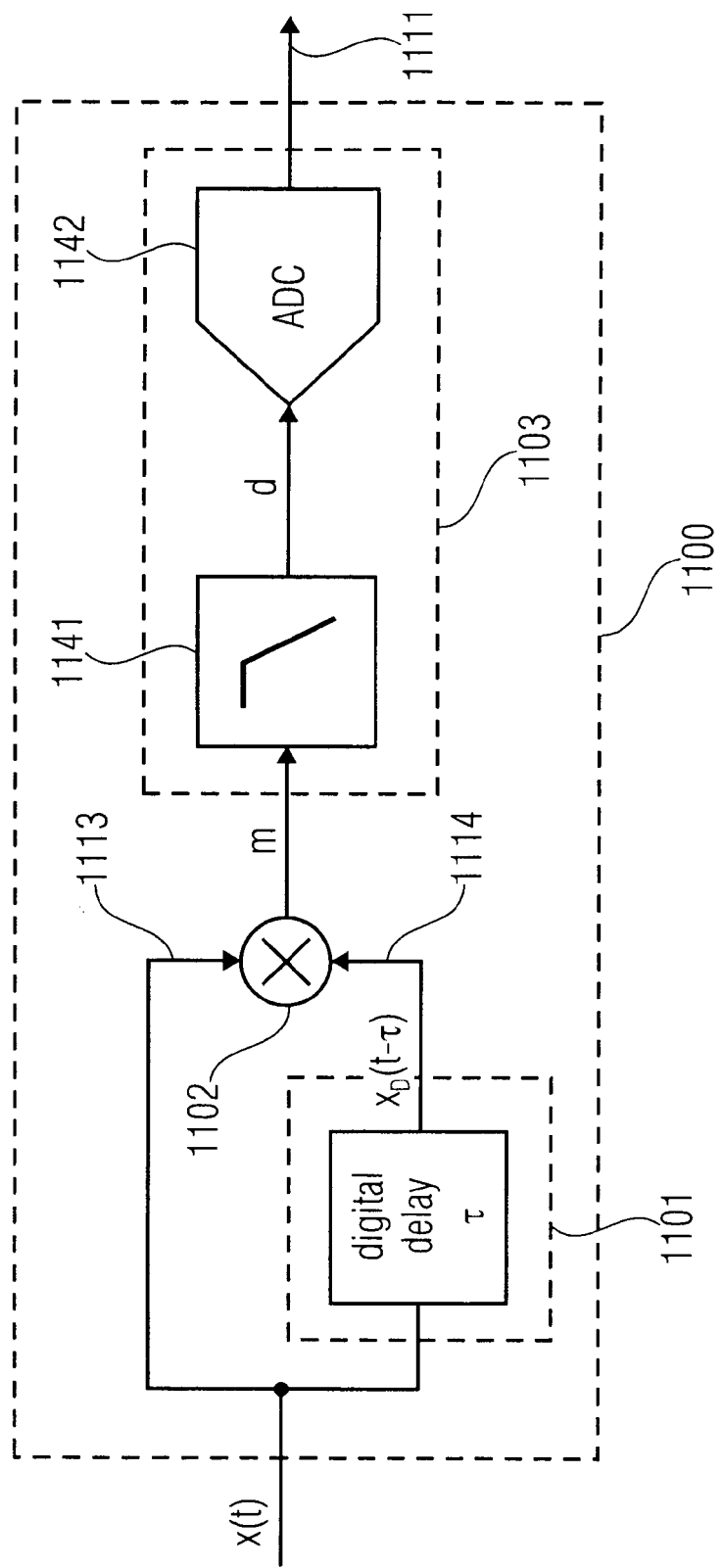
FIG. 8 illustrates an exemplary block diagram of an apparatus comprising a recursive digital delayer, according to an embodiment of the present invention.

FIG. 8 illustrates an exemplary block diagram of an apparatus comprising a recursive digital delayer, according to another embodiment of the invention. The apparatus 1100 comprises a recursive digital delayer 1101, a combiner 1102, and a phase noise determinator 1103. The phase noise determinator 1103 comprises a low-pass filter 1141 and an analog-to-digital converter 1142. The apparatus 1100 may be adapted to receive a test signal x(t) and adapted to provide a phase noise information 1111. The recursive delayer 1101 may be configured to provide a delayed signal $x_D(t-\tau)$ on the basis of the test signal x(t). The combiner 1102 is configured to combine a first signal 1113, which is identical to the test signal x(t), with a second signal 1114, which is identical to the delayed signal $x_D(t-\tau)$, to obtain a combiner output signal m. The phase noise determinator 1103 is configured to provide a phase noise information 1111 that is dependent upon the combiner output signal m. The recursive digital delayer 1101 comprises a digital delay time τ by which the recursive digital delayer 1101 recursively delays the test signal x(t) to obtain the delayed test signal $x_D(t-\tau)$. The recursive digital delayer 1101 is configured to provide the delayed signal $x_D(t-\tau)$ on the basis of the test signal x(t), such that the delayed signal $x_D(t-\tau)$ comprises a superposition of a plurality of time-shifted signal components, which signal components are based on the test signal x(t), and which signal components are shifted in time with respect to each other. The recursive digital delayer 1101 may optionally comprise an analog-to-digital converter (e.g. a 1-bit-quantizer) which is not depicted in FIG. 8 to convert the test signal x(t) to its discrete-time representation $x_D(t)$. The recursive digital delayer 1001 may further comprise a recursive delay line for recursively delaying the discrete-valued (or discrete time) representation of the test signal x(t) and to provide the delayed signal $x_D(t-\tau)$.

The individual signal components of the delayed digital signal $x_D(t-\tau)$ are not explicitly depicted in FIG. 8, they are subsumed by the delayed digital signal $x_D(t-\tau)$. The recursive digital delayer 1101 may correspond to the recursive digital delayer 1001 as illustrated in FIG. 7. The recursive digital delayer 1101 may alternatively correspond to one of the delayers as depicted in one of the FIGS. 2A to 10, wherein components of the delayers are adapted to process digital signals and may comprise, for example, buffers for a delay line, multiplications for an attenuator, RC-circuits (or Hilbert transformers) for a phase shifter or complex valued multiplications for a phase shifter.

Figure 9:
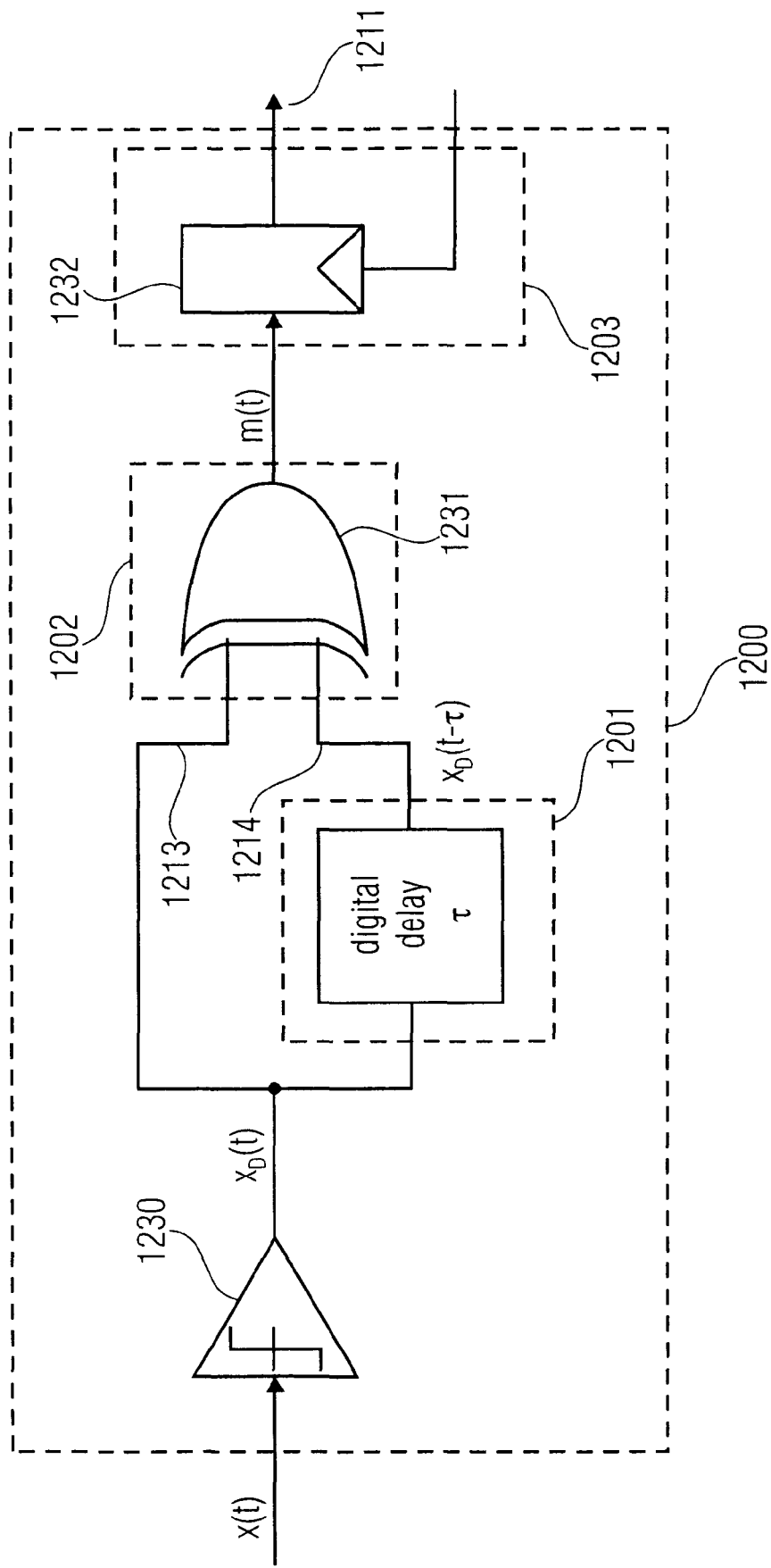
FIG. 9 illustrates an exemplary block diagram of an apparatus comprising a recursive digital delayer, according to an embodiment of the present invention.

FIG. 9 illustrates an exemplary block diagram of an apparatus comprising a recursive digital delayer according to another embodiment of the invention. The apparatus 1200 comprises a recursive digital delayer 1201, a combiner 1202 and a phase noise determinator 1203. The apparatus 1200 is adapted to receive a test signal x(t) and to provide a phase noise information 1211. The apparatus 1200 further comprises a comparator 1230 which is adapted to convert the test signal x(t) to a square-wave test signal $x_D(t)$, wherein the square-wave test signal $x_D(t)$ comprises a first digital value for a positive signal value of the test signal x(t) and comprises a second digital value for a negative signal value of the test signal x(t).

The digital delayer 1201, which may be a recursive digital delayer, comprises a digital delay time τ and may be adapted to recursively delay the square wave test signal $x_D(t)$ to provide a delayed square-wave signal $x_D(t-\tau)$. The delayed square-wave signal $x_D(t-\tau)$ may comprise a superposition of a plurality of time-shifted signal components, shifted by the digital delay time τ or a multiple of the digital delay time τ, wherein the signal components are based on the test signal x(t) or based on the square-wave test signal $x_D(t)$, and which signal components are shifted in time with respect to each other by the digital delay time τ or by a multiple of the digital delay time τ. The combiner 1202 is configured to combine a first signal 1013, which is based on the test signal x(t) and which is identical to the square-wave test signal $x_D(t)$, with a second signal 1214, which is identical to the delayed digital signal $x_D(t-\tau)$, to obtain a combiner output signal m(t).

The combiner 1202 comprises a digital XOR gate which is adapted to perform a logical XOR operation with respect to the first signal 1213 and the second signal 1214 to provide the combiner output signal m(t). Alternatively or in addition, the combiner 1202 may comprise a digital XNOR gate to perform a logical XNOR operation with respect to the first and second signals 1213, 1214 to provide the combiner output signal m(t). The phase noise determinator 1203 comprises a latch or flip flop 1232 being adapted to store the combiner output signal m(t) to provide the phase noise information 1211.

Figure 11:
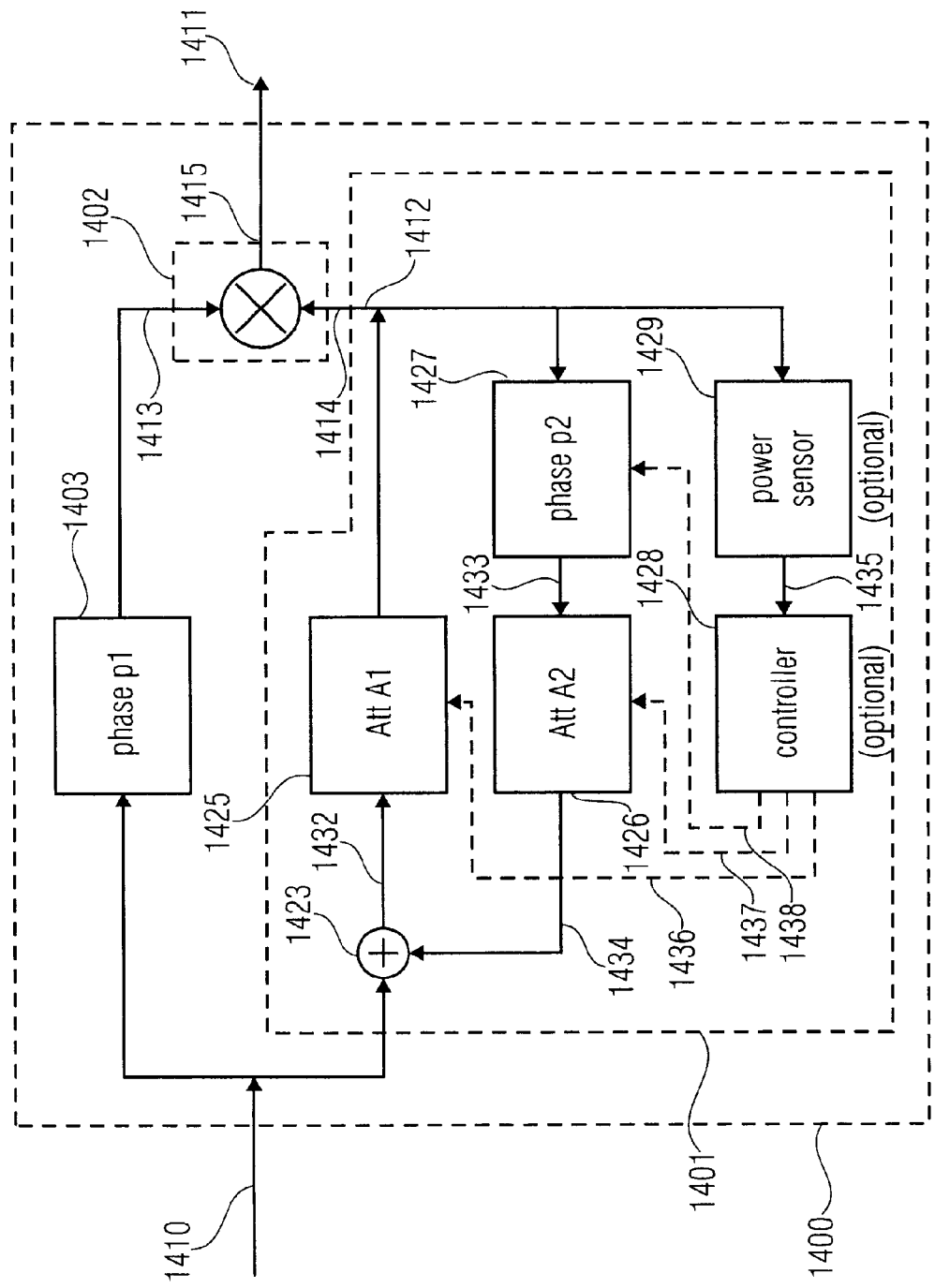
FIG. 11 illustrates an exemplary block diagram of an apparatus comprising an adjustable recursive delayer, according to an embodiment of the present invention.

The digital output $x_D(t)$ of the comparator 1230 may represent values (−1,+1) instead of (0,1). The previously described analog mixer 1102 as illustrated in FIG. 8 may be replaced by a digital XOR gate 1231. Omission of the low pass filter 1141, as illustrated in FIG. 11, which has no obvious simple digital correspondent, may give rise to worries about harmful aliasing effects. However, in some embodiments the aliasing effects are negligible. The initial comparator stage 1230 adds high frequency harmonics to the signal x(t), for example up to the N-th harmonic, which are then (under-) sampled by the flip flop 1232, introducing aliasing. Furthermore, there will be more intermodulation products from the squaring process that may disrupt the ability to distinguish phase noise contributions from different frequencies. The comparator 1230 is adapted to remove amplitude modulation. The XOR gate 1231 performs a mixing function for binary signals representing (−1,+1) to provide the combiner output signal m(t) which comprises intermodulation terms, as there is no filter present that will remove high frequency components. The intermodulation terms around DC may approximate the phase noise differences $\phi(t)-\phi(t-n\tau)$, wherein n denotes a sequence number of the signal components provided by the recursive digital delayer 1201. Unfortunately, other intermodulation products which are related to high frequencies may alias to low frequencies and thus may disrupt the ability to differentiate frequencies of the phase noise spectrum. Nevertheless, in some cases (e.g. for signals having a narrow phase noise distribution), the aliasing may be tolerable.

Figure 10:
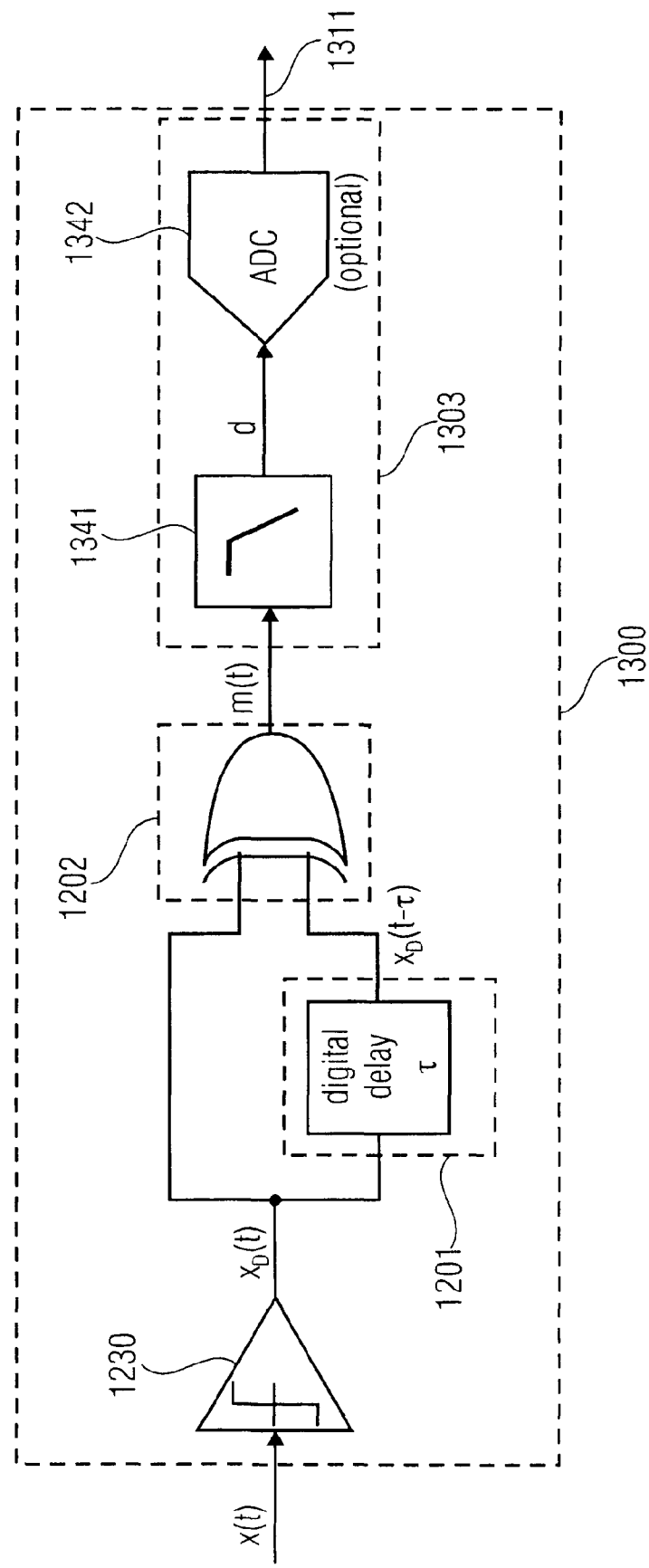
FIG. 10 illustrates an exemplary block diagram of an apparatus comprising a recursive digital delayer according to an embodiment of the present invention.

Another embodiment of the invention as illustrated in FIG. 10 introduces an analog filter subsequent to the XOR gate to cancel out aliasing signal components. FIG. 10 illustrates an exemplary block diagram of an apparatus comprising a recursive digital delayer, according to another embodiment of the invention. The apparatus 1300 comprises a recursive digital delayer 1201 corresponding to the recursive digital delayer 1201 illustrated in FIG. 9, a combiner 1202 corresponding to the combiner 1202 illustrated in FIG. 9, a comparator 1230 corresponding to the comparator 1230 illustrated in FIG. 9 and a phase noise determinator 1303. The embodiment of the invention as illustrated in FIG. 10 differs from the embodiment of the invention as illustrated in FIG. 9 by the phase noise determinator 1303. The phase noise determinator 1303 comprises an analog filter 1341 and an optional analog-to-digital converter 1342. The analog filter 1341 is adapted to filter the combiner output signal m(t), which represents a digital signal, to provide the analog filter output signal d. The analog filter 1341 may filter a digital signal to provide an analog signal. The analog filter output signal d may represent the analog phase noise information 1311. The analog filter output signal d may be optionally converted to a discrete-time representation by the optional analog-to-digital converter 1342 providing the phase noise information 1311 in digital representation. The analog filter 1341 is adapted to remove the higher order intermodulation frequencies aliased to low frequencies such that the analog filter output signal d has a high dynamic range for representing the phase noise of the input signal x(t).

FIG. 11 illustrates an exemplary block diagram of an apparatus comprising an adjustable recursive delayer according to an embodiment of the invention. The apparatus 1400 comprises an adjustable recursive delayer 1401, a combiner 1402, and a phase shifter 1403. The apparatus 1400 is adapted to receive a test signal 1410 and to provide phase noise information 1411 which may be identical to a combiner output signal 1415. The combiner is configured to combine a first signal 1413, which is based on the test signal 1410, with a second signal 1414, which may be identical to a delayed signal 1412, to obtain the combiner output signal 1415. The phase shifter 1403 is adapted to shift the phase of the test signal 1410 by a phase p1 to obtain the first signal 1413. The adjustable recursive delayer 1401 is adapted to recursively delay the test signal 1410 to provide the delayed signal 1412. The adjustable recursive delayer 1401 comprises an adding device 1423, a first attenuator 1425, a second attenuator 1426, a second phase shifter 1427, an optional controller 1428, and an optional power sensor 1429.

The adding device 1423 is adapted to perform an additive superposition of the test signal 1410 and an attenuated second superposition signal 1434 to provide a first superposition signal 1432. The first attenuator 1425 is adapted to attenuate the first superposition signal 1432 by an attenuation A1 to provide the delayed signal 1412 corresponding to the second signal 1414. The second phase shifter 1427 is adapted to phase shift the delayed signal 1412 by a phase of p2 to provide a second superposition signal 1433. The second attenuator 1426 is adapted to attenuate the second superposition signal 1433 by an attenuation A2 to provide the attenuated second superposition signal 1434. p1, p2, A1, and/or A2 may be predetermined parameters or adjustable parameters, for example adjusted by an (adaptive) control algorithm.

The optional power sensor 1429 is adapted to sense a power of the delayed signal 1412 to provide a power control signal 1435. The optional controller 1428 is adapted to receive the power control signal 1435, to process a control algorithm depending on the power control signal 1435, and to provide a first attenuator control signal 1436, a second attenuator control signal 1437, and/or a second phase shifter control signal 1438 depending on the control algorithm. The first attenuator 1425 may be optionally configured to adjust the attenuation A1 responsive to the first attenuator control signal 1436. The second attenuator 1426 may be optionally configured to adjust the attenuation A2 responsive to the second attenuator control signal 1437. The second phase shifter 1427 may be optionally configured to adjust the phase shift p2 responsive to the second phase shifter control signal 1438.

The optional controller 1428 may be configured to provide the second phase shifter control signal 1438 such that the second phase shifter 1427 adjusts the phase p2 for a maximum power of the delayed signal 1412. The optional controller 1428 may be configured to provide the first attenuator control signal 1436 and the second attenuator control signal 1437, such that the first attenuator 1425 and the second attenuator 1426 adjust their respective attenuations A1 and/or A2 to a value slightly below instability with respect to the delayed signal 1412.

The apparatus 1400 may comprise an analog first phase shifter 1403 and/or an analog second phase shifter 1427. However, the apparatus 1400 may also comprise a digital phase shifter 1403 and/or a digital second phase shifter 1427. A digital phase shifter may be for example, a Hilbert transformer or a complex-valued multiplication unit. By sensing the power of the delayed signal 1412 which comprises a superposition of a plurality of time shifted signal components, which signal components are based on the test signal 1410, and which signal components are shifted in time with respect to each other, the controller 1428 is able to control the power of the delayed signal 1412 such that an instability of the adjustable recursive delayer 1404 may be avoided. The phase shifter 1403 may process an analog test signal 1410 and the adjustable recursive delayer 1401 may process a digital version of the test signal 1410. Alternatively, the adjustable recursive delayer 1401 may process an analog test signal 1410 and the phase shifter 1403 may process a digital version of the test signal 1410. Analog signals may be processed within the first phase shifter 1403 and in the recursive delayer 1401.

A further embodiment of the invention comprises the adjustable recursive delayer 1401 without the optional controller 1428 and without the power sensor 1429. The first attenuation A1, the second attenuation A2, and the phase shift p2 may be adjusted by an offline procedure, for example, such that optimal values for the three parameters are determined. The adjustable recursive delayer 1401 may become non-adjustable by fixing the first attenuation A1, the second attenuation A2, and the phase shift p2 to the predetermined optimal values. A non-adjustable recursive delayer 1401 is easier to implement due to a reduced complexity which also may reduce costs.

An adjustable recursive delayer 1401, however, may be used for an automatic test equipment, wherein the optional controller 1428 and the optional power sensor 1429 can automatically adjust the phase p2 for maximum power and wherein the optional controller 1428 and the optional power sensor 1429 can drive the second phase shifter 1427 to (automatically) adjust A1 and/or A2 to a value slightly below instability of the adjustable recursive delayer 1401.

Figure 12:
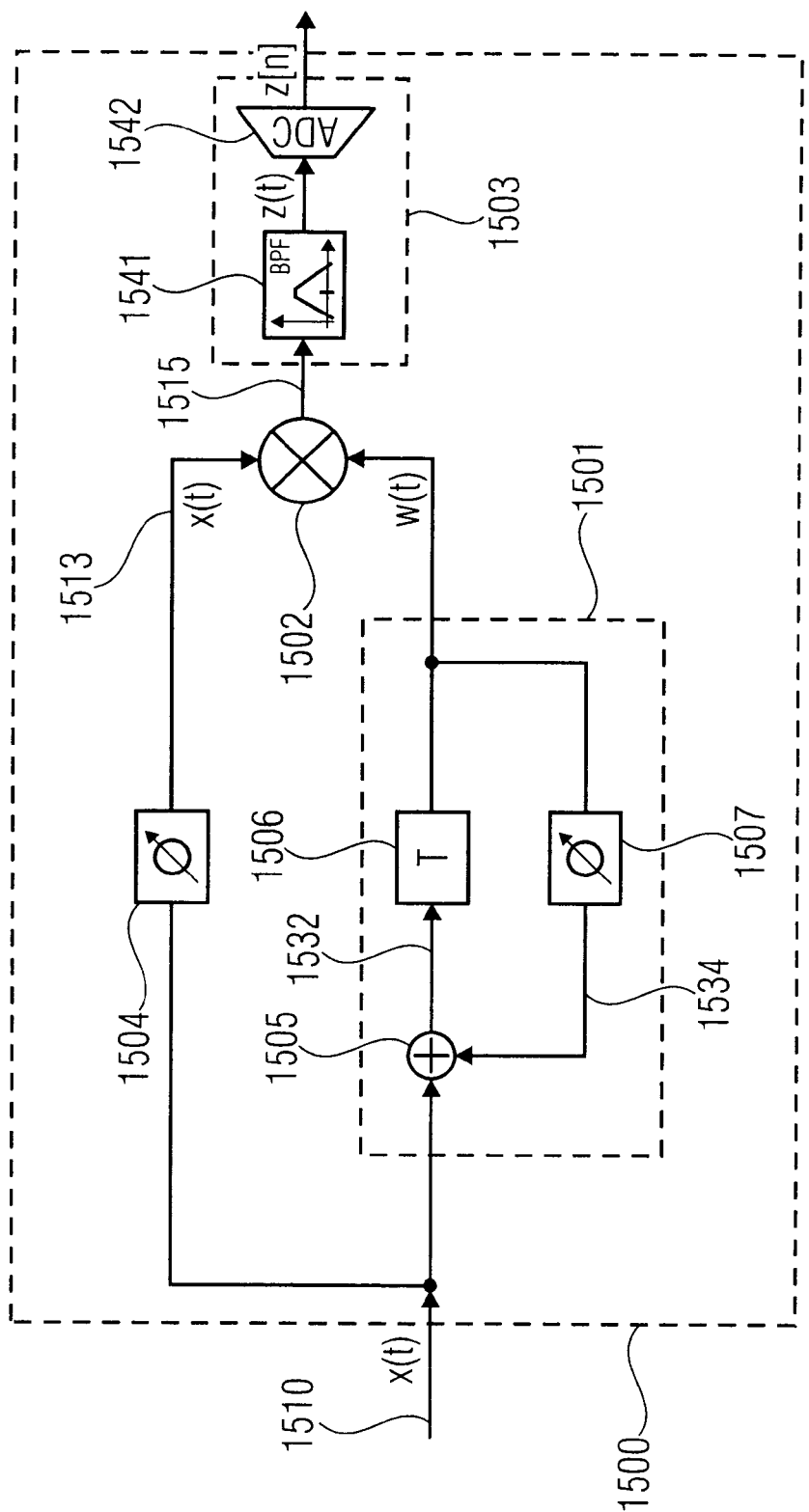
FIG. 12 illustrates an exemplary block diagram of an apparatus comprising a recursive delayer, according to an embodiment of the present invention.

FIG. 12 illustrates an exemplary block diagram of an apparatus comprising a recursive delayer according to another embodiment of the invention. The apparatus 1500 comprises a recursive delayer 1501, a combiner 1502, a phase noise determinator 1503, and a phase shifter 1504. The apparatus 1500 is adapted to receive a test signal 1510 and to provide a phase noise information z(n). The recursive delayer 1501 is adapted to provide a delayed signal w(t) on the basis of the test signal 1510. The combiner 1502 is configured to combine a first signal 1513, which is based on the test signal 1510, with a second signal w(t), which is identical to a delayed signal w(t), to obtain a combiner output signal 1515. The phase noise determinator 1503 is configured to provide a phase noise information z(n) in dependence on the combiner output signal 1515. The phase shifter 1504 is adapted to shift the test signal 1510 in phase to provide the first signal 1513 which is input to the combiner 1502.

The recursive delayer 1501 comprises an adding device 1505, a delay line 1506, and a second phase shifter 1507. The adding device 1505 is adapted to perform an additive superposition of the test signal 1510 and a phase-shifted second signal 1534 to provide a superposition signal 1532. The delay line 1506 is adapted to delay the superposition signal 1532 by a delay time T to provide the second signal w(t). The second phase-shifter 1507 is adapted to shift the second signal w(t) in phase to provide the phase shifted second signal 1534. The phase noise determinator 1503 comprises a band-pass filter 1541 and an (optional) analog-to-digital converter 1542. The band pass filter 1541 is adapted to band-pass filter the combiner output signal 1515 to provide a band-pass filter output signal z(t). The (optional) analog-to-digital converter 1542 is adapted to convert the continuous time representation of the band-pass filter output signal z(t) to a discrete-time representation z(n) which corresponds to the phase noise information.

Figure 13:
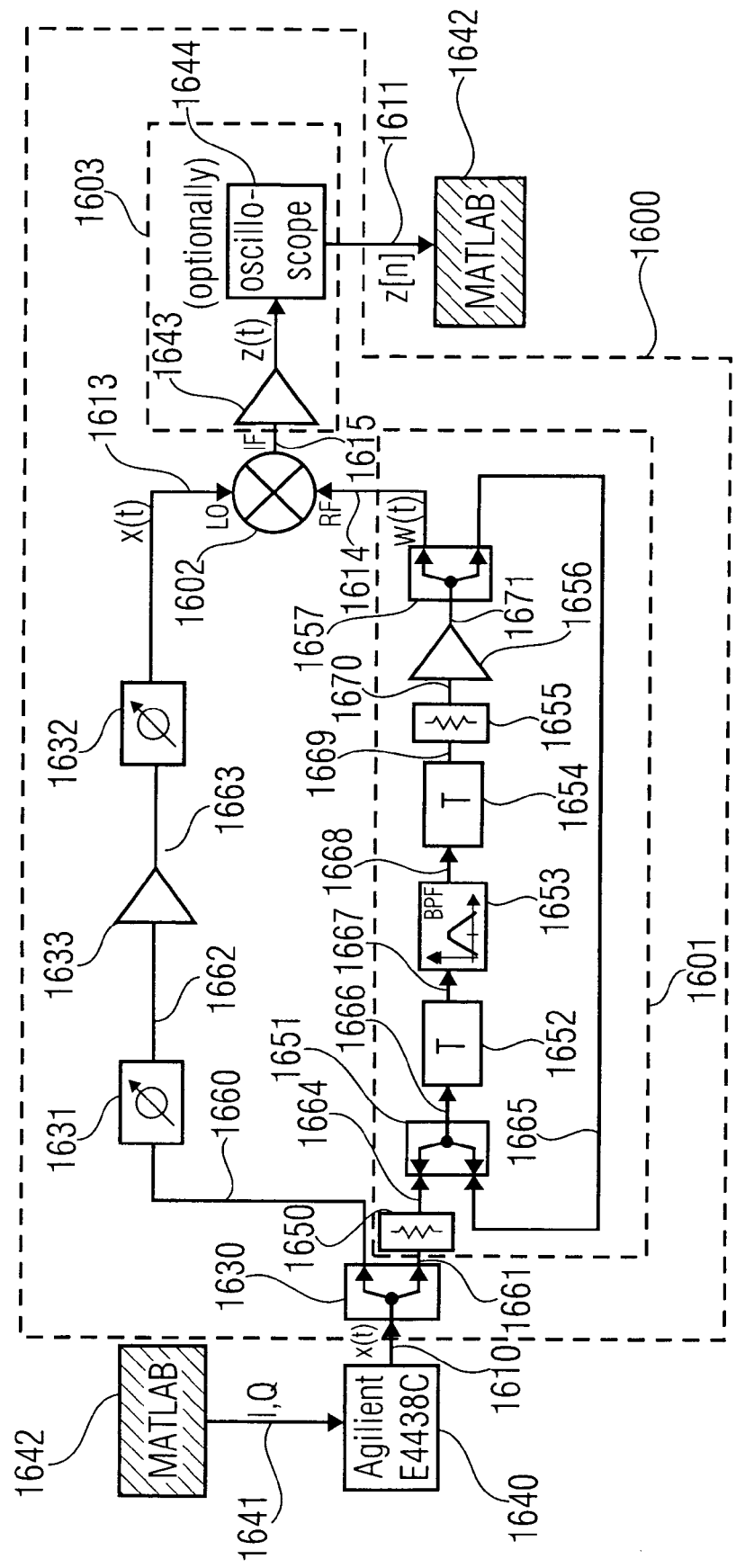
FIG. 13 illustrates an exemplary block diagram of an apparatus comprising a recursive delayer, according to an embodiment of the present invention.

FIG. 13 illustrates an exemplary block diagram of an apparatus comprising a recursive delayer according to another embodiment of the invention. The apparatus 1600 comprises a recursive delayer 1601, a combiner 1602 or a mixer, respectively, and a phase noise determinator 1603. The recursive delayer 1601 is adapted to provide a delayed signal w(t) on the basis of the test signal 1610. The combiner 1602 is configured to combine a first signal 1613, which is based on the test signal 1610, with a second signal 1614, which is identical to the delayed signal w(t), to obtain a combiner output signal 1615. The phase noise determinator 1603 is configured to provide phase noise information z(n) 1611 that depends on the combiner output signal 1615.

The apparatus 1600 may further comprise a power splitter 1630, a first phase shifter 1631, a second phase shifter 1632, and a first amplifier 1633. The test signal 1610 may be provided by a waveform generator 1640, which is adapted to provide the test signal 1610 based on an arbitrary I, Q (in-phase, quadrature) signal 1641, which may be preconfigured by a mathematical simulation device 1642. A exemplary mathematical simulation device may be a computer running mathematical simulation software, which is a software for mathematical calculations, such as provided by MATH-WORKS, inc. ("MATLAB"™). Other mathematical calculation and design software provided by other sources may be used. The I, Q signal 1641 describes the in-phase component I and the phase quadrature component Q of the test signal 1610 to be provided by the waveform generator 1640.

The phase noise determinator 1603 comprises a second amplifier 1643 adapted to amplify the combiner output signal 1615 to provide a continuous time representation of the phase noise information z(t). The phase noise determinator 1603 may optionally comprise an oscilloscope 1644 corresponding to an analog-to-digital converter to convert the continuous-time representation z(t) to the discrete-time representation z(n) of the phase noise information 1611. The phase noise information 1611 may be analyzed by the mathematical simulation device 1642 (e.g., MATLAB™).

The recursive delayer 1601 comprises a first fixed attenuator 1650, a power combiner 1651, a first delay line 1652, a band pass filter 1653, a second delay line 1654, a second fixed attenuator 1655, a third amplifier 1656, and a power divider 1657.

The power splitter 1630 is adapted to split a power of the test signal 1610 to provide a first power splitter output signal 1660 and a second power splitter output signal 1661. The power splitter 1630 is adapted to provide the first and second power splitter output signals 1660, 1661 having approximately the same power. The first phase-shifter 1631 is adapted to shift the phase of the first power splitter output signal 1660 to provide a first phase shifted signal 1662. The first amplifier 1633 is adapted to amplify the first phase-shifted signal 1662 to provide a first amplified phase shifted signal 1663. The second phase shifter 1632 is adapted to phase shift the first amplified phase-shifted signal 1663 to provide the first signal 1613 which is input to the combiner 1602 at a first "LO" input.

The first fixed attenuator 1650 is adapted to attenuate the second power splitter output signal 1661 to provide a first power combiner input signal 1664. The power combiner 1651 is adapted to combine the powers of the first power combiner input signal 1664 and a recursive loop signal 1665 to provide a power combiner output signal 1666. The first delay line 1652 is adapted to delay the power combiner output signal 1666 by a first delay time to provide a first delayed combination signal 1667. The band-pass filter 1653 is adapted to band-pass filter the first delayed combination signal 1667 to provide a band-pass filter output signal 1668. The second delay line 1654 is adapted to delay the band-pass filter output signal 1668 by a second delay time to provide a second delayed combination signal 1669. The second fixed attenuator 1655 is adapted to attenuate the second delayed combination signal 1669 to provide a second fixed attenuator output signal 1670. The third amplifier 1656 is adapted to amplify the second fixed attenuator output signal 1670 to provide a power divider input signal 1671. The power divider 1657 is adapted to split the power divider input signal 1671 to provide the recursive loop signal 1665 and the second signal w(t) 1614 which is input to the combiner 1602 at a second "RF" input of the combiner 1602. The power divider 1657 may be configured to divide the power of the power divider input signal such that the second signal 1614 and the recursive loop signal 1665 have approximately the same power.

Figure 14:
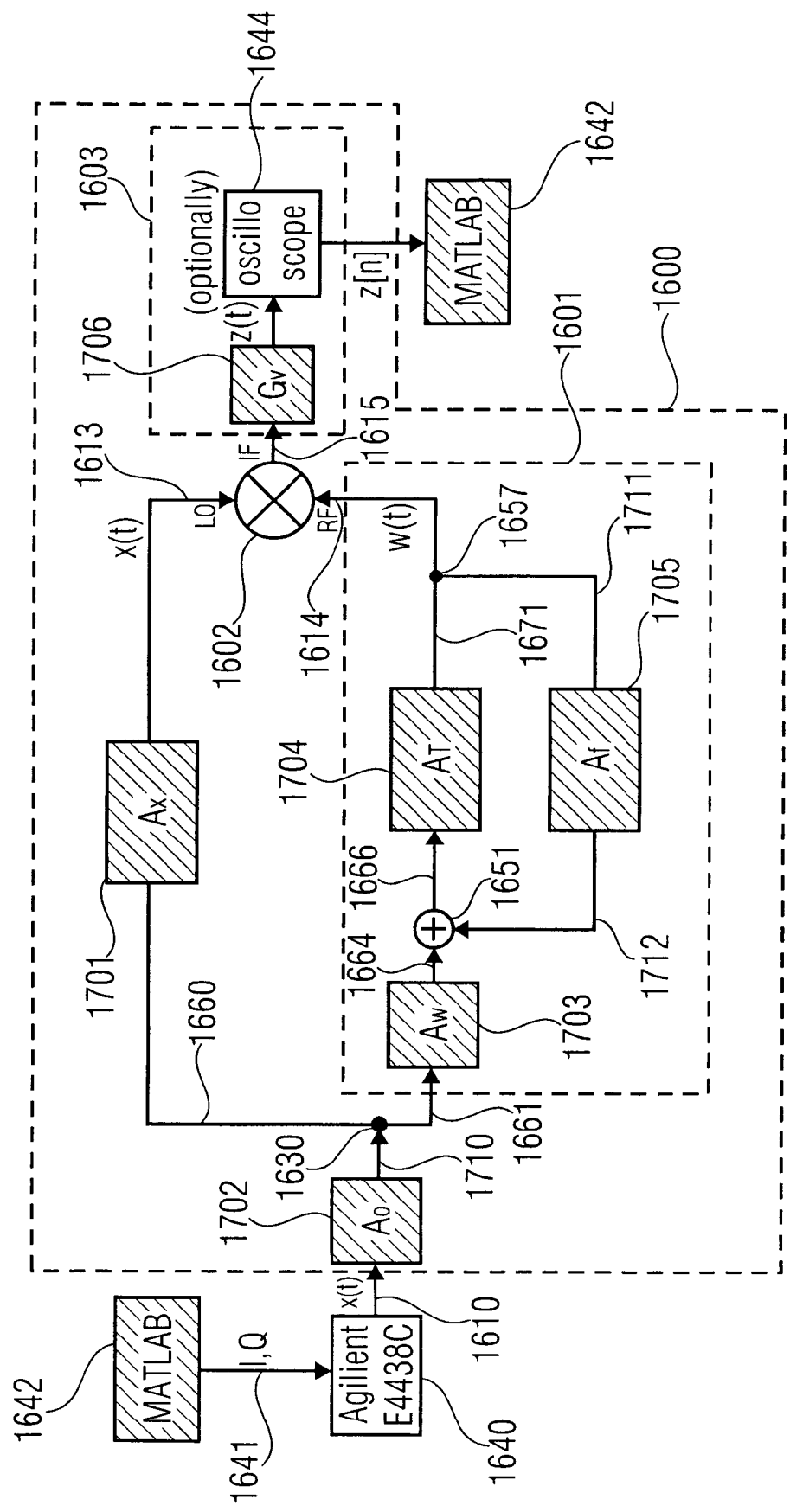
FIG. 14 illustrates an exemplary equivalent block diagram of the apparatus as illustrated in FIG. 13, according to an embodiment of the present invention.

FIG. 14 illustrates an exemplary equivalent block diagram of the apparatus illustrated in FIG. 16 according to an embodiment of the invention. The gains or attenuations, respectively, of the first phase shifter 1631, the second phase shifter 1632, and the first amplifier 1633 (an additional non-idealities and attenuations of cables and real hardware components) may be substituted by a first gain/attenuation device 1701 which is adapted to amplify/attenuate the first power splitter output signal 1660 to provide the first signal 1613. The gains or attenuations from the waveform generator 1640 to the input of the power splitter 1630 may be substituted by a second gain/attenuation device 1702 that is adapted to amplify or attenuate the test signal 1610 to provide a power splitter input signal 1710. The gain or attenuation of the first fixed attenuator 1650 (and additional cables and connecting components) may be substituted by a third gain/attenuation device 1703 which is adapted to attenuate or amplify the second power splitter output signal 1661 to provide the power combiner input signal 1664. The gains or attenuations of the first delay line 1652, the band pass filter 1653, the second delay line 1654, the second fixed attenuator 1655, and the third amplifier 1656 (and the additional cables and connecting components) may be substituted by a fourth gain/attenuation device 1704 which is adapted to amplify/attenuate the power combiner output signal 1666 to provide the power divider input signal 1671. The gain or attenuation of the recursive loop for connecting the second output of the power divider 1657 with the second input of the power combiner 1651 (comprising cables and connecting components) may be substituted by a fifth gain/attenuation device 1705 which is adapted to amplify/attenuate a second power divider output signal 1711 to provide a second power combiner input signal 1712. The recursive loop signal 1665 as illustrated in FIG. 16 corresponds to the second power divider output signal 1711 and to the second power combiner input signal 1712, as in FIG. 16, no explicit device is depicted between the second output of the power divider 1657 and the second input of the power combiner 1651.

The gain or attenuation of the second amplifier 1643 may be substituted by a sixth gain/attenuation device 1706 that is adapted to amplify/attenuate the combiner output signal 1615 to provide the second amplifier output signal z(t).

The first gain/attenuation device 1701 comprises a gain or an attenuation $A_x$. The second gain/attenuation device 1702 comprises a gain or an attenuation $A_0$. The third gain/attenuation device 1703 comprises a gain or an attenuation $A_w$. The fourth gain/attenuation device 1704 comprises a gain or an attenuation $A_T$. The fifth gain/attenuation device 1705 comprises a gain or an attenuation $A_f$. The sixth gain/attenuation device 1706 comprises a gain or an attenuation $G_v$.

Figure 15:
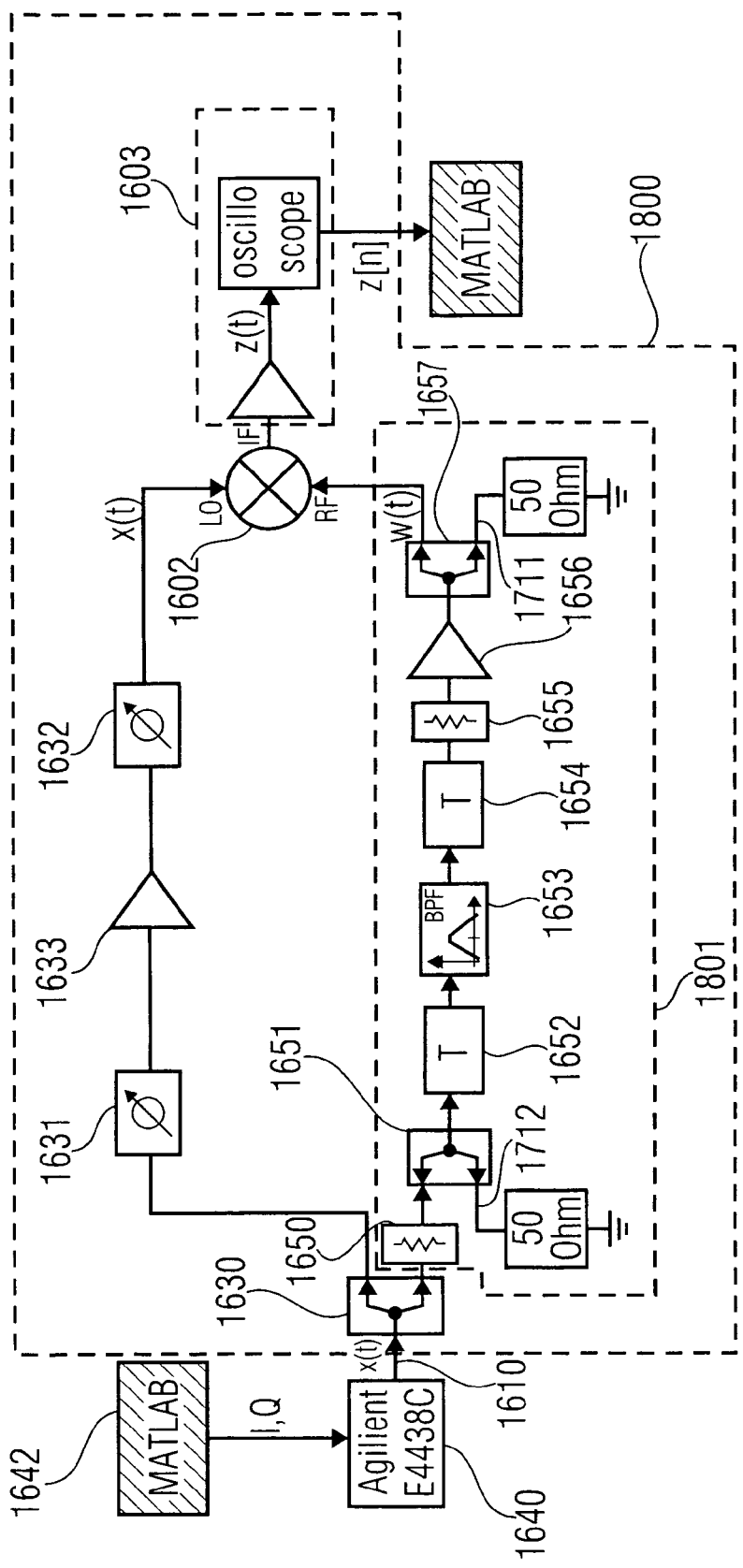
FIG. 15 illustrates an exemplary block diagram of an apparatus comprising a recursive delayer, according to an embodiment of the present invention.

FIG. 15 illustrates an exemplary block diagram of an apparatus comprising a recursive delayer according to another embodiment of the invention. The apparatus 1800 comprises a recursive delayer 1801, a combiner 1602, corresponding to the combiner 1602 illustrated in FIG. 13, a phase noise determinator 1603, corresponding to the phase noise determinator 1603 illustrated in FIG. 13, a power splitter 1630, corresponding to the power splitter 1630 illustrated in FIG. 13, a first phase shifter 1631, a second phase shifter 1632, and a first amplifier 1633 corresponding to the devices 1631, 1632, 1633 as illustrated in FIG. 13. The recursive delayer 1801 is similar to the recursive delayer 1601 illustrated in FIG. 13. The recursive delayer 1801 differs from the recursive delayer 1601 illustrated in FIG. 13 in the loop of the recursive delayer 1801. The recursive delayer 1801 is adapted to connect the second output of the power divider 1657 carrying the second power divider output signal 1711 by a reference impedance, of for example, 50 ohm to electrical ground. The recursive delayer 1801 is further adapted to connect the second input of the power combiner 1651, carrying the second power combiner input signal 1712, by a reference impedance of, for example, 50 ohm to electrical ground. The recursive digital delayer 1801 may implement the recursive loop by connecting the second power divider output signal 1711 to the second power combiner input signal 1712 by an electrical loop via ground.

Figure 16B:
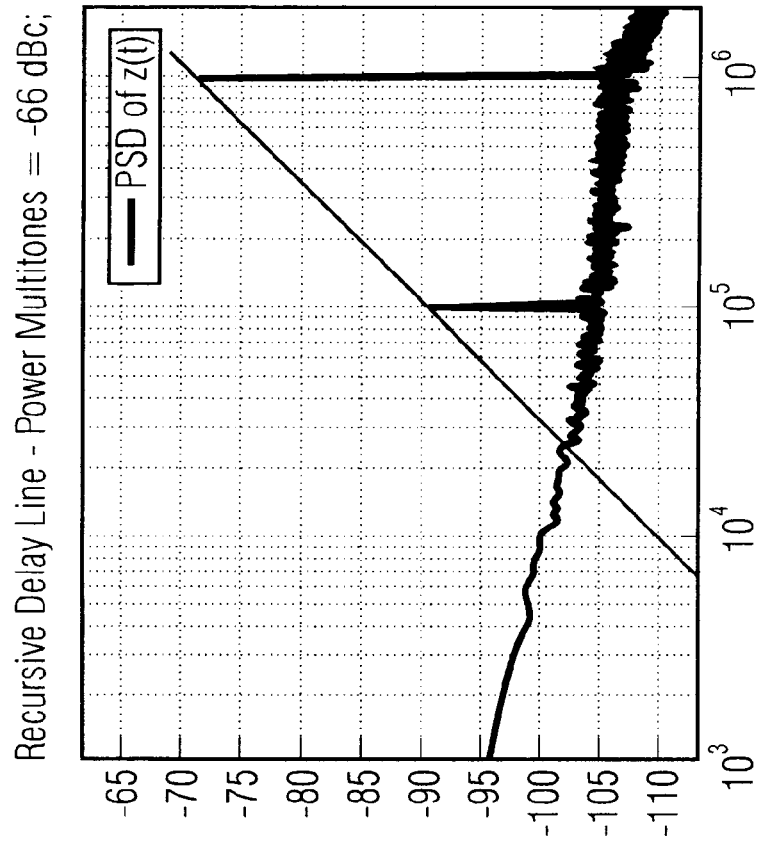
FIG. 16B illustrates an exemplary diagram illustrating the power transmission of the apparatus as illustrated in FIG. 14 for the input signal illustrated in FIG. 16A, the multi-tone modulation having a power of −76 dBm, according to an embodiment of the present invention.
Figure 16A:
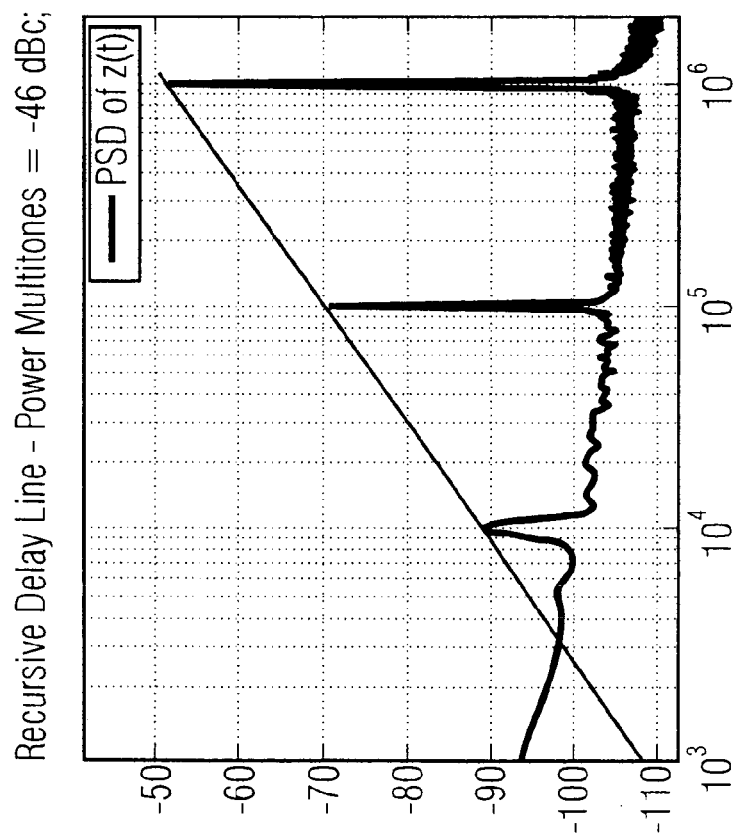
FIG. 16A illustrates an exemplary diagram illustrating a power transmission of the apparatus as illustrated in FIG. 14 for a carrier signal with a multi-tone modulation, applied as input signal to the apparatus, the multi-tone modulation having a power of −56 dBm, according to an embodiment of the present invention.

FIG. 16A illustrates an exemplary diagram illustrating a power transmission of the apparatus 1600 as illustrated in FIG. 14 for a carrier signal with multi-tone modulation, applied as an input signal to the apparatus 1600, with the multi-tone modulation having a power of −56 dBm. FIG. 16B illustrates an exemplary diagram illustrating a power transmission of the apparatus 1600 illustrated in FIG. 14 for the input signal illustrated in FIG. 16Aa, with the multi-tone modulation having a power of −76 dBm. Results of a first set of measurements refer to the recursive delay line structure, and are plotted in FIGS. 16A and 16B. The tones at frequencies of 1 MHz and 100 KHz are clearly visible, both when $P_k$=−46 dBc/Hz, as illustrated in FIG. 16A, and when $P_k$=−66 dBc/Hz, as illustrated in FIG. 19b. The tone at a frequency of 10 KHz is still observable for $P_k$=−46 dBc/Hz, and it is buried in the noise for $P_k$=−66 dBc/Hz. Instead, the value of frequency response $|H(f)|^2$ for f=1 KHz is not large enough to allow the detection of the tone of index k=0. When $P_K$ is decreased of 20 dB, $S_z(f_k)$, k=0, 1, . . . , 3 shows the same decrease, according to the postulated linear behavior of the system. Furthermore, the slope of the power spectrum, and thus equivalently the slope of $|H(f)|^2$, is very close to the theoretical value of 20 dB for each decade in the frequency domain, and is equal to 18.95 dB. This 1 dB variation may be ascribed to a non-linear behavior of the RF components, and in particular to an imperfectly frequency-flat gain of the last baseband amplifier.

Figures 17A, 17B:
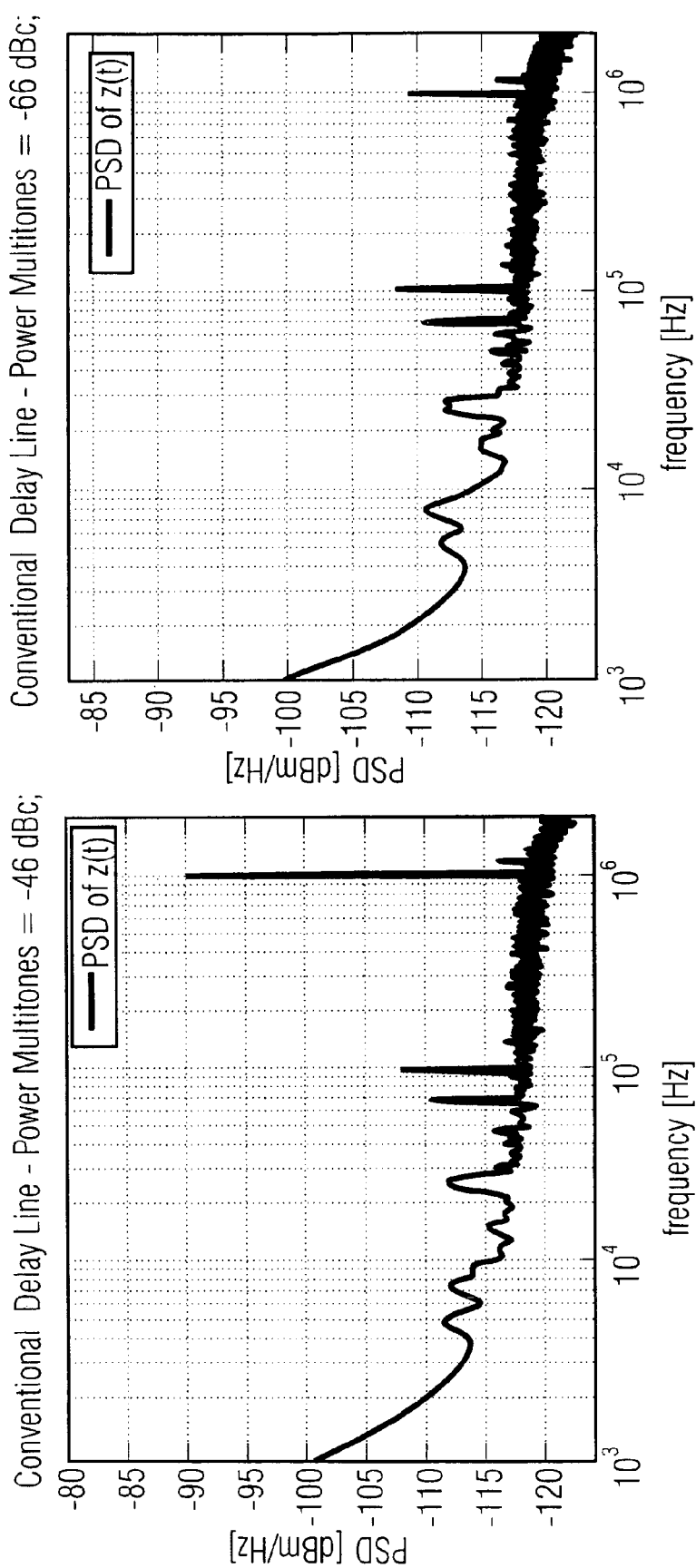
FIG. 17A illustrates an exemplary diagram illustrating a power transmission of the conventional delay line discriminator as illustrated in FIG. 1B for the input signal illustrated in FIG. 16A, the multi-tone modulation having a power of −56 dBm, according to an embodiment of the present invention.
FIG. 17B illustrates an exemplary diagram illustrating the power transmission of the conventional delay line discriminator as illustrated in FIG. 1B for the input signal illustrated in FIG. 16A, the multi-tone modulation having a power of −76 dBm, according to an embodiment of the present invention.

FIG. 17A illustrates an exemplary diagram illustrating a power transmission of the conventional delay line discriminator 130 illustrated in FIG. 1B for the input signal illustrated in FIG. 16A, with the multi-tone modulation having a power of −56 dBm. FIG. 17B illustrates an exemplary diagram illustrating a power transmission of the conventional delay line discriminator 130 illustrated in FIG. 1B for the input signal illustrated in FIG. 16A, with the multi-tone modulation having a power of −76 dBm.

The same input signal as illustrated in FIG. 16A may be applied to the conventional delay line, and the measured results of the signal output PSD plotted in FIGS. 17A and 17B. In one embodiment, the frequency response of the recursive delay line may show a gain of almost 40 dB over the conventional delay line discriminator.

Figure 18A:
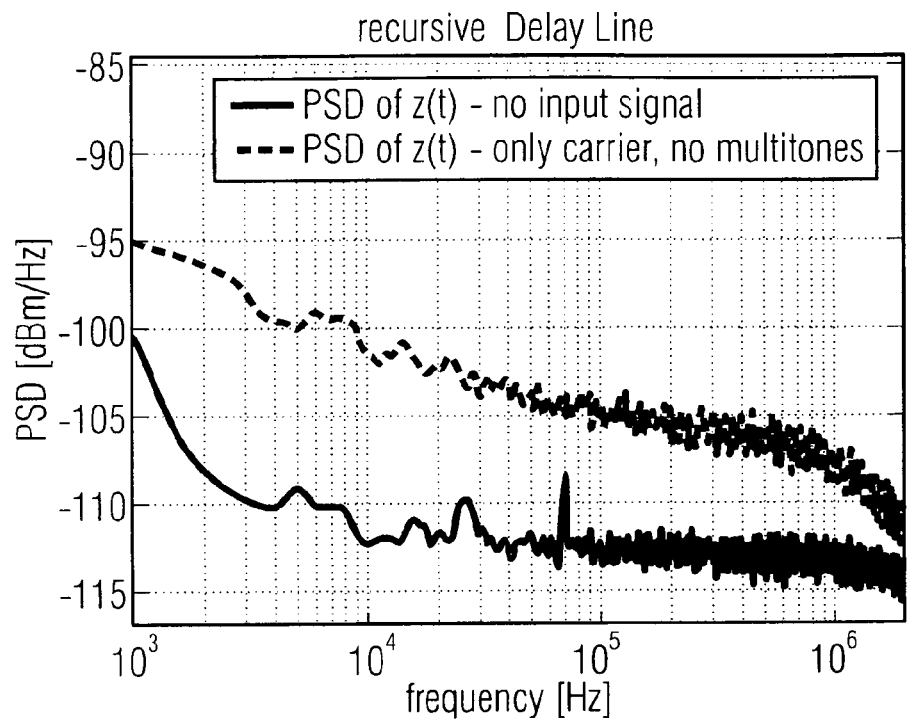
FIG. 18A illustrates an exemplary diagram illustrating the signal-to-noise ratio of the apparatus as illustrated in FIG. 14, according to an embodiment of the present invention.
Figure 18B:
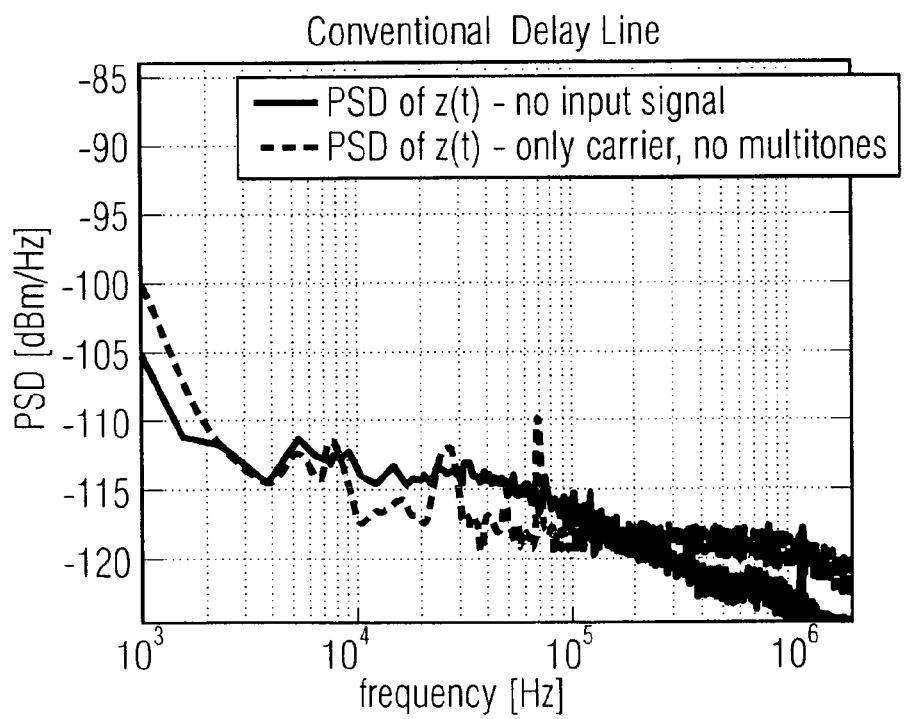
FIG. 18B illustrates an exemplary diagram illustrating the signal-to-noise ratio of the conventional delay line discriminator as illustrated in FIG. 1B, according to an embodiment of the present invention.

FIG. 18A illustrates an exemplary diagram illustrating a signal-to-noise ratio of the apparatus 1600, as illustrated in FIG. 14. FIG. 18B illustrates an exemplary diagram illustrating a signal-to-noise ratio of a conventional delay line discriminator 130 illustrated in FIG. 1B.

In one exemplary embodiment, the noise figure of the recursive delay line may be larger than the noise figure of the single delay line receiver. This may be observed by looking at the noise floor in FIGS. 16A and 16B and FIGS. 17A and 17B, and in more detail in FIGS. 18A and 19B. In one embodiment, a continuous line plots the PSD of the signal z(t) when x(t)=0, and thus only noise is present at the receiver's input. In another embodiment, a dashed line plots the spectrum of the signal z(t) when the multi-tone modulation is turned off, and thus only the carrier is present at the delay line's input. While it can be seen in FIG. 18B that the difference between the two curves is not significant, a much larger discrepancy may be observed in FIG. 18A, which plots a signal spectrum for a recursive delay line structure. In other words, it can be concluded that the product of noise at an LO mixer's input, with a carrier signal at an RF mixer's input (and vice versa) is not negligible, and it must be added to the noise £ noise term for a more accurate evaluation of the system's noise figure. Thus, the SNR may be roughly estimated at f=1 MHz as 56 dB and 27 dB for the recursive and conventional delay line architectures, leading to a final performance improvement of about 30 dB.

Figure 19:
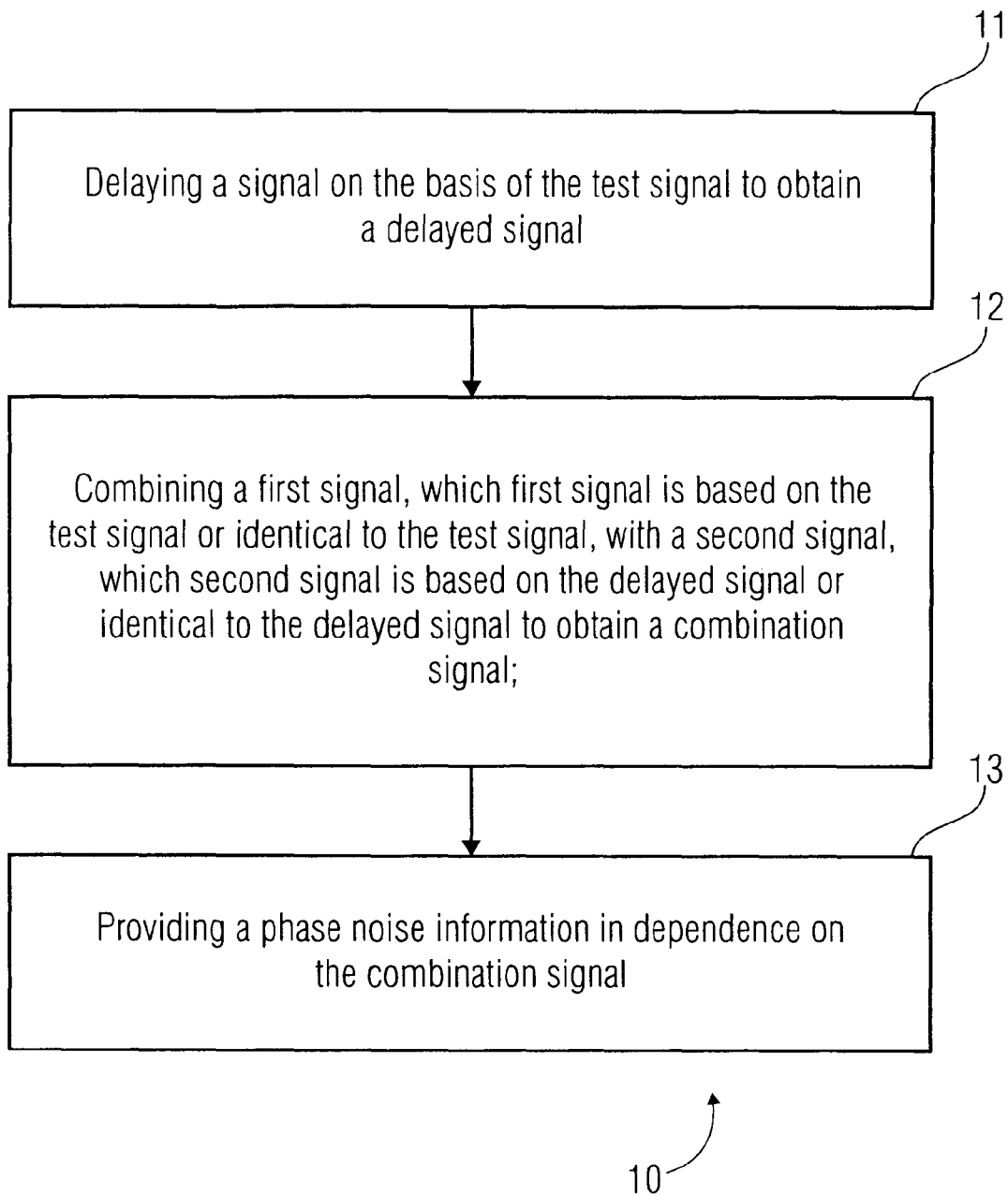
FIG. 19 illustrates an exemplary flow chart for a method for measuring a phase noise of a test signal, according to an embodiment of the present invention.

FIG. 19 illustrates an exemplary flow chart for a method for measuring a phase noise of a test signal according to an embodiment of the invention. The method 10 comprises a first step 11 "recursively delaying a signal on the basis of the test signal to obtain a delayed signal," a second step 12 "combining a first signal, wherein the first signal is based on the test signal or identical to the test signal, with a second signal, wherein the second signal is based on the delayed signal or identical to the delayed signal to obtain a combination signal," and a third step 13 "providing a phase noise information that depends on the combination signal".

Depending on certain implementation requirements of the inventive methods, the inventive methods may be implemented in hardware or in software. The implementation can be performed using a digital storage medium, in particular a disc, DVD or a CD having electronically readable control signals stored thereon, which cooperate with a programmable computer system such that the inventive methods are performed. Generally, the present invention is, therefore, a computer program product with a program code stored on a machine-readable carrier, the program code being operative for performing the methods described herein when the computer program product runs on a computer. In other words, the methods described herein are, therefore, a computer program having a program code for performing at least one of the methods described herein when the computer program runs on a computer.

To summarize, delay line discriminators may provide a relatively easy and low-cost solution for phase noise measurements. However, they are known to suffer severe sensitivity loss for close-in phase noise measurements. The performance of a delay line based architecture, which exploits a feed-back path to enhance the measurement sensitivity is discussed herein. First, theoretical derivations and analytical results are presented to illustrate a new architecture concept, and then a simple experiment based on real world measurements may be performed with a prototype instrument, as discussed herein. The measured data show an outstanding gain of about 40 dB over the conventional delay line discriminator, an enhancement which is however slightly attenuated by an approximately 10 dB increased noise figure of this architecture concept, due to the feedback path. These results may be obtained for a single frequency.

The output of a physical oscillator can be written as:

$$x(t) = V_X |1 + a(t)| \cos|\omega_C t + \phi(t)|, \quad (1)$$

where $V_x$ is the signal amplitude, a(t) represents the AM noise, and A(t) the PM noise, the latter also referred to as phase noise. The angular deviation A(t) may involve both deterministic and random components, however in general only the random fluctuations are of interest. By neglecting the AM noise, the above output may be rewritten as:

$$x(t) = V_X \cos[\omega_C t + \phi(t)] = V_X \{\cos[\phi(t)] \cos(\omega_C t) - \sin[\phi(t)] \sin(\omega_C t)\}, \quad (2)$$

and, for small phase modulations, i.e. $|\Phi(t)| \ll 1$, the following may be obtained:

$$x(t) = V_x |\cos(\omega_C t) - \phi(t) \sin(\omega_C t)|, \quad (3)$$

wherein the approximations $\cos|\Phi(t)| \approx 1$ and $\sin|\Phi(t)| \approx \Phi(t)$ are used.

While a direct spectrum measurement and a reference source measurement rely on a clean, low phase noise RF source, the delay line discriminator illustrated in FIG. 13 does not need a dedicated RF source reference. A splitter is used to divide the RF signal into two equal level signals. One is applied directly to a mixer, while the second one is routed to a delay line, passed through a phase shifter, and then fed into the mixer.

The signal w(t) at the output of the phase shifter, after passing through the delay line, may be defined as:

$$w(t) = V_X \cos[\omega_C(t-\tau) + \phi(t-\tau) - \alpha], \quad (4)$$

where α is an adjustable phase shift introduced by the phase shifter, and τ is a lag of the delay line. Then, the signal at the output of the mixer and after a lowpass filter $h_{LPF}(t)$ is given by:

$$\begin{aligned} z(t) &= [x(t)w(t)] * h_{LPF}(t) \\ &= V_z \cos[\phi(t) - \phi(t-\tau) + \theta], \\ &= V_z \{\cos(\theta) - \sin(\theta)[\phi(t) - \phi(t-\tau)]\}, \end{aligned} \quad (5)$$

where $\theta = 2\pi f_c \tau + \alpha$ is the phase shift between the two signals at the mixer's input, and $V_z$ is the signal amplitude which can be written as $V_Z = A_{SYS} V_X \ldots$ (6), wherein $A_{SYS}$ may be the overall gain (attenuation) of the system. In one exemplary embodiment, gain and attenuation terms may be indistinctly used, with both defined as the ratio between the output and the input signal power. In general, the gain term may be used if the ratio is larger than unity, and the attenuation term otherwise. If the phase shifter α is tuned such that $\theta = \pi/2$, then the output signal becomes $z(t) = V_Z[\phi(t) - \phi(t-\tau)] \ldots$ (7), which can be thought as the response of the LTI filter h(t) to the input $\phi(t)$, as illustrated in FIG. 1C, and written as $z(t) = V_Z \phi(t) * h(t) \ldots$ (8), where * denotes a convolution operation, and $h(t) = \delta(t) - \delta(t-\tau) \ldots$ (9).

Using equation (8), a (normalized) power spectral density (PSD) may be computed of the output signal z(t) as $S_z(f) = V_Z^2 |H(f)|^2 S_\phi(f) \ldots$ (10), wherein $S_Z(f)$, $S_\phi(f)$ represent the power spectral densities of the signals z(t), Φ(t), respectively, and H(f) is the frequency response of the filter with impulse response h(t), given by H(f)=1−exp(−j2πfτ). The following is then provided:

$$|H(f)|^2 = H(f)H^*(f) = 2 - \exp(-j2\pi f\tau) - \exp(+j2\pi f\tau) = 2[1 - \cos(2\pi f\tau)] = [2\sin(\pi f\tau)]^2 \quad (11).$$

In one exemplary embodiment, voltages are considered across 1 Ohm resistors, so that an instantaneous power is given by $p(t)=v(t)i(t)=v^2(t)$, and $S(f)=F\{R_v(\tau)\}$, where $F\{.\}$ is a Fourier transform operator, and $R_v(\tau)=E\{v(t)v(t+\tau)\}$ is a voltage autocorrelation function. Since reasonable values of τ may be in the order of a few nanoseconds, for small values of the frequency (typically for f<1 MHz), it holds fτ<<1 and |H(f)| can be accurately approximated with $|H(f)| \approx 2\pi f\tau$ ... (12), and therefore: $S_z(f) \approx (2\pi f\tau)^2 V_z^2 S_\phi(f)$ ... (13).

The equation above shows that the phase noise PSD $S_\phi(f)$ may be obtained through the PSD measurement of the output signal z(t), provided that the frequency response's magnitude |H(f)| and system attenuation $A_{sys}$ are known. Using the dB scale, the PSD of the output signal z(t) in [dBm/Hz] becomes:

$$S_Z(f)[\text{dBm/Hz}] = (-164 + \tau + f)[\text{dB}] + P_X[\text{dBm}] + ASYS [\text{dB}] + P_\phi(f)[\text{dBc/Hz}] \quad (14),$$

wherein $\tau[\text{dB}] \equiv 20 \log_{10}(\tau/1 \text{ ns})$, $f[\text{dB}] \equiv 20 \log_{10}(f/1 \text{ Hz})$, $P_x[\text{dBm}] = 10 \log_{10}(V_x)^2/1 \text{ mV})$ is the carrier power (across a 1Ω resistor) in dB, and $A_{sys}[\text{dB}] = 20 \log_{10}(A_{SYS})$.

In one exemplary embodiment, equation (13) may be used to show that the power spectral density $P_z(f)$: increases 20 dB for each decade in the frequency (offset) domain, increases 20 dB for each decade in the delay domain; with these results depending on phase noise PSD, carrier power, and system attenuation.

In one exemplary embodiment, a typical source for GSM applications may be considered, with $S_\Phi = [-60, -80, -110, -130, -140]^T$ dBc/Hz, measured at the following frequency offsets: [1 KHz, 10 KHz, 100 KHz, 1 MHz, 10 MHz] ... (15). In addition, the following may be considered: a carrier power $P_x = 0$ dBm, a delay line with τ=1 ns, and an ideal system with $A_{SYS} = 0$ dB. Then the following may be obtained: $S_z(f)[\text{dBm/Hz}] = (-164 + f)[\text{dB}] + S_\phi(f)[\text{dBm/Hz}]$ ... (16), which, when evaluated at frequencies of interest, provide the following vector:

$$S_z = -164 + [60, 80, 100, 120, 140]^T + S_\phi = [-164, -164, -174, -174, -164]^T[\text{dBm/Hz}] \quad (17).$$

This last equation may show that the delay line discriminator method considerably attenuates the power spectral density of the phase noise for frequencies close to the carrier, and consequently suffers from reduced sensitivity to close-in phase noise measurements. The low-frequencies' strong attenuation has however the merit to significantly reduce the dynamic range of the signal at the ADC's input, with important benefits in terms of quantization noise. In particular, for the examined case, the signal power will most likely drop below the noise floor, and the measurement would be most likely impossible.

Two ways to improve the measurement are suggested by equation (14). For example, the DUT (device under test) may be directed to increase the power of the carrier $P_x$; further, longer delay lines may be used. However, both these approaches are limited by technological constraints, since neither the power $P_x$ nor the delay τ can be made arbitrarily large. Realistic values may produce a gain of 30 dB (e.g., P=10 dBm, τ=10 ns), which might be yet insufficient to raise the signal spectrum from noise floor.

One concern of delay line discriminator architecture is the poor performance for close-in phase measurements, due to the strong attenuation that low-frequency components undergo when passing through the delay line discriminator. In some embodiments, this attenuation can be so strong that the signal falls below the noise floor, making a phase noise measurement virtually impossible. In one exemplary embodiment, a receiver architecture, as illustrated in FIG. 3, reduces the signal attenuation, e.g. enhancing the frequency response $|H(f)|^2$.

The above embodiment may be similar to the receiver architecture presented in the previous section, with the notable difference that after the delay line, the signal is split in two parts: one is routed to the mixer, and the other is first passed through a phase shifter, and then fed back to the delay line. In one embodiment, this structure is a recursive delay line, because at each iteration the accumulated delay is increased by τ ns. In one embodiment, the phase shifter may be the most critical component, as it must be programmed to phase align the signal from the feedback path with the signal coming from the direct path. In one exemplary embodiment, the signal under test is denoted as x(t), and the signal after the (recursive) delay line is denoted as w(t). By denoting with $A_\tau$ and with $A_f$ the attenuations corresponding to the direct path (e.g., the attenuation due to the delay line) and to the feedback line, respectively, the following can be written:

$$w(t) = V_X A_\tau \cos[\omega_C t + \phi(t - \tau)] + V_X A_\tau^2 A_f \cos[\omega_C t + \phi(t - 2\tau)] + \ldots \quad (18)$$
$$= V_X \sum_{n=1}^{\infty} A_\tau^n A_f^{n-1} \cos[\omega_C t + \phi(t - n\tau)],$$

and thus:

$$z(t) = V_Z \cos[\omega_0 t + \phi(t) + \theta] * \quad (19)$$
$$\sum_{n=1}^{\infty} A_\tau^n A_f^{n-1} \cos[\omega_C t + \phi(t - n\tau)]$$
$$= V_Z \sum_{n=1}^{\infty} A_\tau^n A_f^{n-1} \{\cos(\theta) - \sin(\theta)[\phi(t) - \phi(t - n\tau)]\}$$
$$= V_Z \left\{ \frac{A_\tau}{1 - A_\tau A_f} [\cos(\theta) - \sin(\theta)\phi(t)] + \sin(\theta) \sum_{n=1}^{\infty} A_\tau^n A_f^{n-1} \phi(t - n\tau) \right\}.$$

If the phase difference between the two mixer's input signals is tuned to 90 degree, then the following equation is possible:

$$z(t) = -V_Z \left\{ \frac{A_\tau}{1 - A_\tau A_f} \phi(t) - \sum_{n=1}^{\infty} A_\tau^n A_f^{n-1} \phi(t - n\tau) \right\}. \quad (20)$$

Neglecting the (irrelevant) sign, the impulse recursive delay line response is given as $$h(t) = \frac{A_\tau}{1 - A_\tau A_f} \delta(t) - \sum_{n=1}^{\infty} A_\tau^n A_f^{n-1} \delta(t - n\tau), \quad (21)$$

and the frequency response is given by:

$$H(f) = \frac{A_\tau}{1 - A_\tau A_f} - \sum_{n=1}^{\infty} A_\tau^n A_f^{n-1} e^{-j2\pi f\tau}, \quad (22)$$

which can be written as:

$$H(f) = \frac{A_\tau}{1-A_\tau A_f} - \frac{A_\tau e^{-j2\pi f\tau}}{1-A_\tau e^{-j2\pi f\tau}A_f} = \frac{A_\tau}{1-A_\tau A_f} - \frac{1-e^{-j2\pi f\tau}}{1-A_\tau A_f e^{-j2\pi f\tau}}, \quad (23)$$

whereas for the conventional delay line, the frequency response may be given by: $H(f)=1-\exp(-j2\pi f\tau)$.

With the approximation $f\tau=1$, the following can then be obtained:

$$|H(f)|^2 \approx (2\pi f\tau)^2 \left(\frac{A_\tau}{1-A_\tau A_f}\right)^2 \frac{1}{(1-A_\tau A_f)^2 + (2\pi f\tau A_\tau A_f)^2} \approx \quad (24)$$

$$(2\pi f\tau)^2 \left(\frac{A_\tau^2}{(1-A_\tau A_f)^4}\right).$$

The PSD of the output signal z(t) in [dBm/Hz] may therefore become: $S_Z(f)[\text{dBM/Hz}]=(-164+\tau+f)[\text{dB}]+G[\text{dB}]+P_x[\text{dBm}]+A_{SYS}[\text{dB}]+P_\phi(f)[\text{dBc/Hz}] \ldots (25)$, where $$G[\text{dB}] \triangleq 20\log 10 \left[\frac{A_\tau}{(1-A_\tau A_f)^2}\right] \quad (26)$$

represents the gain of the recursive delay line architecture over the conventional structure, as seen by comparing equation (25) with equation (14).

It is clear from equation (26) that the largest gain is obtained when the attenuations $A_\tau$ and $A_\tau A_f$ are the smallest possible. Therefore, the following can be realistically considered: $A_\tau=-1$ dB and $A_f=-0.5$ dB, to which ideally corresponds an outstanding gain of G=62 dB. Even though most likely the delay line has an attenuation larger than 1 dB, an amplifier may be added to make the overall open-loop gain as close as possible to 0 dB The block diagram plotted in FIG. 13 describes the components used to build a prototype of the recursive delay line, where all the components have been connected with SMA cables. First, a signal source is needed with a controllable phase noise. For this purpose, the IQ arbitrary waveform generator capability provided by an exemplary Agilent E4438C vector signal generator may be used. Since in general the signal generated by a physical oscillator can be written as: $x(t)=\cos[\omega t+\phi(t)]=\cos[\phi(t)]\cos(\omega_c t)-\sin[\phi(t)]\sin(\omega_c t)\ldots$ (27), a phase noise waveform $\Phi(t)$ with arbitrary PSD can be synthesized by providing the exemplary Agilent instruments with the I and Q samples computed as $\cos(\Phi(t))$ and $\sin(\Phi(t))$, respectively. Once the desired PSD is chosen, a single realization of the stochastic process $\Phi(t)$ is generated with an algorithm implemented with mathematical simulation software, and the I and Q samples are computed and downloaded to the instrument by using a GPIB interface. The instrument can be controlled by using the Instrument Control Toolbox available in MATLAB™, and by using a dedicated IVI-COM driver, such as available from the Agilent website.

As pointed out in the previous section, the gain of the recursive delay line over conventional delay line discriminators depends critically on the attenuation of the open-loop and feed-back paths, which are schematically indicated in FIG. 14 as $A_\tau$ and $A_f$ respectively. FIG. 14 is an equivalent description of the real hardware setting, plotted in FIG. 13, where the non-ideality and attenuation of cables and real components are grouped together, according to the physical position in the prototype. Thus, for instance, the attenuation due to the cable connecting the Agilent source with the power splitter, and the loss due to the power splitter itself, are grouped in the block with gain (attenuation) $A_O$. Similarly, the non-ideality of the power combiner, the loss of the delay line, the attenuator, the gain of the amplifier, and the loss of the power divider before the mixer, are grouped in the term $A_\tau$, the open-loop gain. $A_x$ represents the attenuation experienced from the signal traveling from the output of the first power splitter to the input of the mixer, $A_w$ is the fixed attenuator inserted before the closed-loop implementing the recursive delay line, $A_f$ is the attenuation of the signal passing through the feedback path, and $G_v$ is the gain of the baseband amplifier, required to raise the signal level to values adequate for the oscilloscope. The choice and position of the components in FIG. 14 are dictated by the following considerations listed in table 1.

TABLE 1

It must hold $A_\tau < 0$ dB and $A_f < 0$ dB, for all the frequencies, in order to avoid unwanted oscillations. Meanwhile, they must be as close as possible to 0 dB, in order to guarantee the desired gain, as illustrated in Equation (26), over the conventional delay line. The recommended signal power at the LO mixer's input is 7 dBm, and the input 1 dB compression point is equal to 1 dBm.

In order to satisfy the first condition, an amplifier with ideally a gain slightly smaller than the attenuation due to the passive RF components should be placed just after the power combiner. In one embodiment, the gain of the available amplifier exceeded the attenuation of the delay lines and power slitter/combiner, thus an extra attenuator may be placed in the direct path of the loop. In addition, care must be taken to make sure that the amplifier operates in the linear regime, requiring the insertion of another attenuator ($A_w$) between the first splitter and the power combiner. In one exemplary embodiment, the insertion of such attenuators considerably increased the noise figure of the overall system, with consequent loss of measurement sensitivity. These considerations may lead to the choice of the architecture depicted in FIG. 16, where the value of the first attenuator is −8 dB, and the value of the second attenuator, positioned between the delay line and the amplifier, is −10 dB.

In one embodiment, the value of the parameters in the equivalent representation of FIG. 14 have been measured as: $A_O=-4.6$ dB, $A_X=+21$ dB, $A_w=-8$ dB, $A_\tau=-0.35$ dB, and $A_f=-0.42$ dB. In one embodiment, the power of the input signal x(t) is set to equal to −10 dBm, and thus the power of the LO signal is approximately equal to 6.5 dBm, and the power of the RF signal is approximately equal to −5 dBm.

A final remark regards the absence of the phase shifter in the feedback path of the recursive delay line. In order to demonstrate the concept of this novel architecture, focus was placed on a single frequency, and thus a frequency is selected for which the signal after the feedback path is phase aligned with the signal directly entering the recursive delay line. One frequency verifying this condition has been found to be equal to 3.226027 GHz.

As already anticipated, the insertion of unnecessary attenuators may increase the noise figure of the system, however, the experiments discussed herein were to verify and quantify the gain of the recursive delay line structure over conventional delay line discriminators. This comparison is discussed below.

By recalling that for both structures it holds: $S_Z(f)=V_Z^2|H(f)|^2 S_\phi(f) \ldots$ (28), where the absolute value of the frequency response is analytically evaluated as $|H(f)|=2\pi f\tau$ . . . (29) for the conventional delay line discriminator, and is given as $$|H(f)| \approx (2\pi f\tau)\frac{A_\tau}{(1-A_\tau A_f)^2}, \quad (30)$$

for the recursive delay line, the goal is to measure and compare the frequency responses of the two competing architectures. In one embodiment, the recursive delay line's hardware setup is the one illustrated in FIG. 13, while the hardware configuration of the conventional delay line discriminator is illustrated in FIG. 15. With this choice, the value of $V_Z$ is the same for both the architectures, and thus the performance of the two measurement systems can be compared by simply measuring the PSD of the output signal z(t), e.g. $S_Z(f)$. Before proceeding with the PSD measurements, a simple verification may be performed on the assumption that $V_Z$ is the same for both architectures. By tuning the phase shifter in such a way that $\theta=0$, from equation (5) and equation (19), the following may be obtained: $z(t)^{(c)}=V_Z$ . . . (31), and $z(t)^{(\tau)}=V_Z(A_\tau/(1-A_\tau A_f))$ . . . (32), for the conventional and recursive delay line architectures, respectively. In one embodiment, measuring z(t) in both cases at an oscilloscope (without the amplifier $G_v$, which is inherently passband), the following is acquired: $z(t)^{(C)}=13.74$ mV and $z(t)^{(\tau)}=146$ mV. Their ratio in dB is approximately 20.5 dB, which is in agreement with the theoretical value of $20\log_{10}(A_\tau/(1-A_\tau A_f))=20.74$ dB, computed by substituting in the previous expression the measured values of $A_\tau=-0.35$ dB and $A_f=-0.42$ dB.

After this verification, the performance of the two architectures may be compared by measuring the PSD of z(t) for $\theta=\pi/2$, with the same input signal x(t). In one exemplary embodiment, for all measurements an oscilloscope sampling frequency has been set to 10 Msa/s. The values may be read, for example, using exemplary Agilent VEE software, and may be then exported to mathematical software, such as MATLAB™, where the PSD of the samples z[n] is computed using the Welch's algorithm, where the voltages have been normalized to a reference impedance of 50Ω. The exemplary oscilloscope's memory is equal to 32768 samples, and 15 blocks of samples are acquired and used to evaluate the PSD. Thus, in total the following samples may be taken: 32768× 15=491520 samples, corresponding to an observation window of 49.2 msec.

In order to highlight the frequency response, in one embodiment, the system may be excited with a multitone input signal, where the tones have the following frequency offset from the carrier $f_C=3.226027$ GHz: $f_K=10^{(3+K)}$ Hz . . . (33) for k=0, 1, . . . , 3. In one embodiment the input carrier power is set to −10 dBm, and the power of the multi-tones is first set to −56 dBm, and then set to −76 dBm. Hence, the PSD $S_\phi(f)$ is given by $S_\phi(f)=P_K\Sigma_{k=0}^3\delta(f-f_K)$ . . . (34) where $P_K=\{-56, -76\}+10=\{-46, -66\}$ dBc/Hz.

The results of the first set of exemplary measurements refer to the recursive delay line structure, and are plotted in FIGS. 16A and 16B. The tones at frequencies of 1 MHz and 100 KHz are clearly visible both when $P_K=-46$ dBc/Hz, as illustrated in FIG. 16A, and also when $P_K=-66$ dBc/Hz, as illustrated in FIG. 16b. The tone at a 10 KHz frequency is still observable for $P_K=-46$ dBc/Hz, and it is buried in the noise for $P_K=-66$ dBc/Hz. Instead, the value of a frequency response $|H(f)|^2$ for f=1 KHz is not large enough to allow the detection of the tone associated with index k=0. As expected, when $P_K$ is decreased by 20 dB, $S_Z(f_K)$, k=0, 1, . . . , 3 shows the same decrease, according to the postulated linear behavior of the system. This may also show that the slope of the power spectrum, and thus equivalently the slope of $|H(f)|^2$, is very close to the theoretical value of 20 dB for each decade in the frequency domain, and is equal to 18.95 dB. This 1 dB variation may be ascribed to the non-linear behavior of the RF components, and in particular to a non-perfectly frequency-flat gain of the last baseband amplifier.

The same input signal has been applied to the conventional delay line, and the measured results of the signal output PSD are plotted in FIGS. 17A and 17B. One conclusion from these results is that the frequency response of the recursive delay line shows a gain of almost 40 dB over the conventional delay line discriminator.

However, the noise figure of the recursive delay line is larger than the noise figure of the single delay line receiver. This can be observed by looking at the noise floor in FIGS. 16A and 16B and in FIGS. 17A and 17B, and in more detail in FIGS. 18A and 18B. On one hand, a continuous line plots the PSD of the signal z(t) when x(t)=0, and thus only noise is present at the receiver's input. On another hand, a dashed line plots the spectrum of the signal z(t) when the multi-tone modulation is turned off, and thus only the carrier is present at the delay line's input. While it can be seen in FIG. 18B that the difference between the two curves is not significant, a much larger discrepancy can be observed in FIG. 18A, which plots the signal spectrum for the recursive delay line structure. Therefore, it can be concluded that the product of the noise at the LO mixer's input with the carrier signal at the RF mixer's input (and vice versa) is not negligible, and it must be added to the noise term for a more accurate evaluation of the system's noise figure. Thus, it is possible to roughly estimate the SNR at f=1 MHz as 56 dB and 27 dB for the recursive and conventional delay line architectures, leading to a final performance improvement of about 30 dB.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. An apparatus for measuring phase noise of a test signal, the apparatus comprising:
    a recursive delayer comprising a feedback path and configured to produce a delayed signal recursively on the basis of a test signal;
    a combiner configured to combine a first signal with a second signal to produce a combiner output signal, wherein the first signal is based on the test signal, and wherein the second signal is based on the delayed signal; and
    a phase noise determiner configured to determine phase noise information depending on the combiner output signal.

2. The apparatus according to claim 1, wherein the combiner is further configured to multiply the first signal with the second signal to provide the combiner output signal, or to XOR-combine the first signal with the second signal to produce the combiner output signal.

3. The apparatus according to claim 1, wherein the recursive delayer is configured to produce the delayed signal on the basis of the test signal, wherein the delayed signal comprises a superposition of a plurality of time-shifted signal components, wherein further the plurality of time-shifted signal components are based on the test signal, and wherein the signal components are shifted in time with respect to each other.

4. The apparatus according to claim 3, wherein the recursive delayer is further configured to produce the delayed signal wherein the delayed signal further comprises an additive superposition of the plurality of time-shifted signal components.

5. The apparatus according to claim 3, wherein the recursive delayer is further configured to produce the delayed signal, wherein carriers of the plurality of time-shifted signal components are in-phase with respect to each other within a tolerance range of substantially +/−10°.

6. The apparatus according to claim 3, wherein the recursive delayer is further configured to attenuate signal components in a feed-back path of the recursive delayer, wherein the signal components decay and the second signal is limited in power.

7. The apparatus according to claim 3, wherein the recursive delayer is further configured to produce the delayed signal, wherein the time shifted signal components are shifted in time with respect to the test signal by one of a quarter period of a carrier of the test signal, and a quarter period plus an integer number of full periods of the carrier of the test signal, and a quarter period plus an integer number of half periods of the carrier of the test signal.

8. The apparatus according to claim 1, wherein the recursive delayer is further configured to produce the delayed signal on the basis of the test signal, wherein the delayed signal comprises a plurality of time-shifted versions of the test signal.

9. The apparatus according to claim 1 further comprising a receiver configured to receive a radio frequency (RF) signal having a carrier frequency between 3 kHz and 300 THz.

10. The apparatus according to claim 1, wherein a carrier of the second signal is in phase quadrature to a carrier of the first signal within a tolerance range of approximately +/−10°.

11. The apparatus according to claim 1, wherein the phase noise determiner is configured to determine information describing a phase noise power that depends on an output signal of the combiner.

12. The apparatus according to claim 1, wherein the phase noise determiner comprises a low-pass filter configured to filter the combiner output signal to provide a low-pass filter output signal.

13. The apparatus according to claim 12, wherein the phase noise determiner further comprises a power detector configured to produce a signal describing the phase noise power.

14. The apparatus according to claim 12, wherein the phase noise determiner is configured to produce the phase noise power information depending on a power of the low-pass filter output signal.

15. The apparatus according to claim 12, wherein the phase noise determiner further comprises an analog-to-digital converter configured to convert a continuous-time representation of the low-pass filter output signal into a discrete-time representation of the low-pass filter output signal.

16. The apparatus according to claim 1, further comprising:
a first delay line configured to delay the test signal to provide the first signal, wherein the recursive delayer comprises a first adding device configured to add the test signal to a second superposition signal to provide a first superposition signal;
an attenuator configured to attenuate the first superposition signal to provide an attenuated first superposition signal;
a second delay line configured to delay the attenuated first superposition signal to provide the second superposition signal; and
a second adding device configured to add the test signal to the second superposition signal to provide the delayed test signal.

17. The apparatus according to claim 16, wherein the first delay line is further configured to delay the test signal by one of a quarter period of the carrier of the test signal and a quarter period plus a multiple number of half periods of the carrier of the test signal, wherein the second delay line is further configured to delay the attenuated first superposition signal by one of a half period of the carrier of the test signal and a multiple number of full periods of the carrier of the test signal.

18. The apparatus according to claim 1, wherein the recursive delayer comprises:
an adding device configured to add the test signal to the second signal to produce a superposition signal;
an attenuator configured to attenuate the superposition signal to produce an attenuated superposition signal; and
a delay line configured to delay the attenuated superposition signal to produce the second signal.

19. The apparatus according to claim 18, further comprising a phase shifter configured to phase shift the test signal to produce the first signal.

20. The apparatus according to claim 1 further comprising an input node configured to receive a digitally quantized version of the test signal.

21. The apparatus according to claim 20, wherein the digitally quantized version of the test signal is a logic signal.

22. The apparatus according to claim 20, wherein the recursive delayer comprises a buffer, configured to delay the digitally quantized version of the test signal, and wherein the recursive delayer is configured to output the content of the buffer to provide the delayed signal depending on a control signal.

23. The apparatus according to claim 20 further comprising:
a first delay line configured to delay the digitally quantized version of the test signal to produce a first digitally delayed test signal;
a first adding device configured to add the first digitally delayed test signal and a second digitally delayed test signal to produce a digital superposition signal;
an attenuator configured to attenuate the digital superposition signal to produce an attenuated digital superposition signal;
a second delay line configured to delay the attenuated digital superposition signal to produce the second digitally delayed test signal; and
a second adding device configured to add the second digitally delayed test signal and the first digitally delayed test signal to produce the delayed test signal.

24. The apparatus according to claim 23, wherein the first and second delay lines comprise one of buffers and Hilbert transformers to delay respective delay line input signals to produce respective delay line output signals.

25. The apparatus according to claim 20, wherein the combiner is configured to digitally combine the first signal with the second signal.

26. The apparatus according to claim 20, wherein the combiner is configured to digitally combine the first signal with the second signal and comprises an XOR gate configured input the first signal and the second signal.

27. The apparatus according to claim 1, further comprising:
a first phase shifter configured to shift a phase of the test signal to produce the first signal,
wherein the recursive delayer comprises:
a power combiner configured to combine a power of the test signal and a power of an attenuated phase-shifted second signal by an additive superposition to produce a superposition signal;
a first attenuator configured to attenuate the superposition signal to produce the delayed test signal,
a second phase shifter configured to shift a phase of the delayed test signal to produce a phase-shifted second signal; and
a second attenuator configured to attenuate the phase-shifted second signal to produce the attenuated phase-shifted second signal.

28. The apparatus according to claim 27, wherein the recursive delayer further comprises:
a power sensor configured to sense a power of the second signal to produce a power sensor output signal depending on the power of the second signal;
a controller configured to output a first attenuator control signal, a second attenuator control signal, and a second phase shifter control signal, wherein the three control signals depend on the power sensor output signal;
wherein the first attenuator is further configured to attenuate the superposition signal responsive to the first attenuator control signal;
wherein the second attenuator is further configured to attenuate the phase-shifted second signal responsive to the second attenuator control signal; and
wherein the second phase shifter is further configured to shift the phase of the delayed test signal responsive to the second phase shifter control signal.

29. The apparatus according to claim 28, wherein the controller is configured to produce the three control signals such that a power of the second signal is maximized with respect to a relevant stability range.

30. The apparatus according to claim 1 further comprising
a first phase shifter configured to shift a phase of the test signal to output the first signal,
wherein the recursive delayer comprises:
a power combiner configured to output a power of the test signal and a power of a phase-shifted second signal to produce a superposition signal;
a delay line configured to delay the superposition signal to output the second signal; and
a second phase shifter configured to shift a phase of the second signal to output the phase-shifted second signal,
wherein the phase noise determiner comprises a bandpass filter configured to filter the combiner output signal to generate a bandpass filter output signal describing the phase noise information.

31. A method for measuring a phase noise of a test signal, comprising;
recursively delaying a test signal or a signal based on the test signal, to produce a delayed signal;
generating a first signal based on the test signal;
generating a second signal based on the delayed signal; and
providing phase noise information depending on the combination signal.

* * * * *